(12) United States Patent
Bergemont et al.

(10) Patent No.: US 6,180,994 B1
(45) Date of Patent: Jan. 30, 2001

(54) ARRAY OF SIDEWALL-CONTACTED ANTIFUSES HAVING DIFFUSED BIT LINES

(75) Inventors: Albert Bergemont, Palo Alto; Alexander Kalnitsky, San Francisco, both of CA (US)

(73) Assignee: National Semiconductor Corporation, Santa Clara, CA (US)

(*) Notice: Under 35 U.S.C. 154(b), the term of this patent shall be extended for 0 days.

(21) Appl. No.: 09/234,007

(22) Filed: Jan. 19, 1999

(51) Int. Cl.$^7$ ................................................. H01L 29/00
(52) U.S. Cl. ......................... 257/530; 257/635; 257/734
(58) Field of Search ................................ 257/530, 635, 257/754

(56) References Cited

U.S. PATENT DOCUMENTS

| | | | |
|---|---|---|---|
| 4,424,578 | * | 1/1984 | Miyamoto ........................... 257/530 |
| 4,502,208 | * | 3/1985 | McPherson ......................... 257/530 |
| 4,647,340 | * | 3/1987 | Szluk et al. ......................... 257/530 |
| 5,070,384 | * | 12/1991 | McCollum et al. ................ 257/530 |
| 5,233,206 | | 8/1993 | Lee et al. ............................. 257/50 |
| 5,246,874 | | 9/1993 | Bergemont .......................... 437/52 |
| 5,392,189 | | 2/1995 | Fazan et al. . | |
| 5,397,726 | | 3/1995 | Bergemont .......................... 437/48 |
| 5,449,633 | | 9/1995 | Bergemont .......................... 437/48 |
| 5,481,493 | | 1/1996 | Bergemont ...................... 365/185.18 |
| 5,590,068 | | 12/1996 | Bergemont ............................ 365/63 |

OTHER PUBLICATIONS

Hamdy, E. et al., "Dielectric Based Antifuse For Logic and Memory IC's," International Electron Devices Meeting (Dec. 11–14, 1988) pp. 786–789.

Liu, D. et al, "Scaled Dielectric Antifuse Structure for Field–Programmable Gate Array Applications," IEEE Electron Devices Letters, vol. 12, No. 4, Apr. 1991, pp. 151–153.

Chen, K., et al, "A Sublithographic Antifuse Structure for Field–Programmable Gate Array Applications," IEEE Electron Devices Letters, vol. 13, No. 1, Jan. 1992, pp. 53–55.

* cited by examiner

Primary Examiner—J. Carroll
(74) Attorney, Agent, or Firm—Limbach & Limbach L.L.P.

(57) ABSTRACT

An array of sidewall-contacted antifuses is formed by a method that reduces the sensitivity of the array to masking alignment errors. The array includes a plurality of spaced-apart bit lines which are formed in a semiconductor material. Rows and columns of insulated contacts are formed on the semiconductor material such that each bit line is contacted a plurality of times by an insulated contact. In each row of contacts, each contact has an exposed sidewall. A plurality of word lines are formed over the contacts such that a word line is formed over each exposed sidewall in a row of exposed sidewalls. The word line includes a dielectric layer and a conductive layer.

15 Claims, 19 Drawing Sheets

ARRAY OF SIDEWALL-CONTACTED ANTIFUSES HAVING DIFFUSED BIT LINES

RELATED APPLICATIONS

This application is related to application Ser. No. 09/233,370 for METHOD FOR FORMING AN ARRAY OF SIDEWALL-CONTACTED ANTIFUSES HAVING DIFFUSED BIT LINES by Albert Bergemont et al. which is filed on an even date herewith.

BACKGROUND OF THE INVENTION

1. Field of the Invention

The present invention relates to an array of antifuses and, more particularly, to an array of sidewall-contacted antifuses having diffused bit lines.

2. Description of the Related Art

Unlike a fuse which, when programmed, changes from a low-resistance to a high-resistance device to block a current from flowing through the device, an antifuse is a device which, when programmed, changes from a high-resistance to a low-resistance device to allow a current to flow through the device.

FIG. 1 shows a plan drawing that illustrates a portion of a conventional antifuse array 100. FIG. 2 shows a cross-sectional drawing taken along line 2—2 of FIG. 1. As shown in FIGS. 1 and 2, array 100 includes a series of polysilicon (poly) bit lines BL1–BLm which are formed on a first layer of oxide 110. As further shown, each bit line BL has a series of projections P1–Pn which, in turn, each have an end sidewall 112.

In addition, array 100 further includes a second layer of oxide 114 which is formed over bit lines BL1–BLm and oxide layer 110, but which is not formed on the end sidewalls 112 and the regions of oxide layer 110 that lie between opposing end sidewalls 112.

Array 100 also includes a series of word lines WL1–WLn which are formed on oxide layers 110 and 114 and the end sidewalls 112 such that a word line WL is connected to all of the end sidewalls 112 in a row of end sidewalls. Each word line WL, in turn, includes a dielectric layer DL and an overlying poly layer PL.

The resulting structure forms a plurality of sidewall-contacted antifuses 116 in that an antifuse 116 is formed each time a word line WL contacts the end sidewall 112 of a bit line BL.

In operation, each antifuse 116 is used to store one of two logic values depending on whether or not the dielectric associated with the antifuse is intact. For example, antifuse A represents a first logic state when the dielectric of word line WL1 formed over end sidewall 112 of bit line BL1 is intact in that no current can flow from word line WL1 to bit line BL1 (or in the opposite direction). Thus, when normal operating voltages are applied to word line WL1, only a fraction of the voltage is coupled to bit line BL1.

On the other hand, antifuse A represents a second logic state when the dielectric of word line WL1 formed over end sidewall 112 of bit line BL1 has been broken down and thus, is no longer intact, in that current can now flow from word line WL1 to bit line BL1 (or in the opposite direction). Thus, when normal operating voltages are applied to word line WL1, substantially all of the voltage is present on bit line BL1.

The dielectric region of a word line that forms an antifuse is typically broken down by establishing a strong electric field across the dielectric region. This programming of the antifuse changes the logic state of the antifuse from the first logic state to the second logic state.

For example, with antifuse A, the dielectric of word line WL1 formed over end sidewall 112 of bit line BL1 breaks down when a 10.6V pulse is applied to word line WL1 while bit line BL1 is grounded.

One of the problems with antifuse array 100 is that antifuses 116 are sensitive to masking alignment errors that occur during fabrication. FIGS. 3A–3F show a series of plan views that illustrate the fabrication of antifuse array 100. (See also Chen et al., A Sublithographic Antifuse Structure for Field Programmable Gate Array Applications, *IEEE Electron Device Letters*, Vol. 13, No. 1, January 1992.)

As shown in FIG. 3A, antifuse array 100 is fabricated by depositing a layer of first polysilicon (poly-1) 310 over a layer of oxide 312. After this, poly-1 layer 310 is masked and etched to form a poly structure 314 which includes a first strip 316, a second strip 318, and a plurality of connecting strips 320 that connect the first and second strips 316 and 318 together.

Following this, poly-1 layer 310 is again masked and etched to reduce the widths W of connecting strips 320 to a dimension which is less than the minimum dimension that can be photolithographically obtained by the fabrication process.

Following this, as shown in FIG. 3B, a thick layer of oxide 322 is formed over strips 316, 318, and 320, and the exposed portions of oxide layer 312. Next, a mask 324 is formed and patterned on oxide layer 322 to expose the regions of oxide layer 322 that are formed over the center portions of connecting strips 320. After this, the unmasked areas of oxide layer 322 and the underlying portions of strips 320 are etched to form bit lines BL1–BLm.

However, as shown in FIG. 3C, if mask 324 is vertically misaligned, then the etch will fail to form bit lines BL1–BLm. Instead, the etch will leave connecting strips 320 partially or fully intact, depending on the extent of the misalignment.

As shown in FIG. 3D, if mask 324 is properly aligned, the next step following the last etch is to form a layer of dielectric material 326 on the top and sidewall surfaces of oxide layer 322, the end sidewalls of bit lines BL1–BLm, and a top surface of oxide layer 312.

Next, a layer of second polysilicon (poly-2) 328 is formed over dielectric layer 326. Following this, a mask 330 is formed and patterned over poly-2 layer 328. The unmasked areas of poly-2 layer 328 and the underlying areas of dielectric layer 326 are then etched to form word lines WL1–WLn as shown in FIG. 3E.

However, as shown in FIG. 3F, if mask 330 is vertically misaligned, then the etch will fail to form word lines WL1–WLn over connecting strips 320. Thus, alignment errors during the placement of masks 324 and 330 can result in the formation of nonfunctioning antifuses.

As a result, there is a need for an antifuse array which is less sensitive to masking alignment errors.

SUMMARY OF THE INVENTION

Conventionally, the method for forming an array of sidewall-contacted antifuses is sensitive to masking alignment errors that occur during the fabrication of the array. This sensitivity can lead to lower than desired manufacturing yields. The present invention provides an array of sidewall-contacted antifuses which is less sensitive to masking alignment errors, thereby increasing the manufacturing yields.

In accordance with the present invention, an antifuse array, which is formed on a semiconductor material of a first conductivity type, includes a plurality of spaced-apart bit lines of a second conductivity type which are formed in the semiconductor material.

The array also includes a layer of insulation material which is formed on the semiconductor material over the bit lines. The layer of insulation material has a plurality of openings, which are arranged in rows and columns, that expose a plurality of bit line regions in each bit line.

The array of the present invention further includes a plurality of spaced-apart contacts which are formed on the bit line regions such that each contact is connected to an exposed bit line region. In addition, a layer of isolation material is formed over the layer of insulation material and the contacts such that each contact has an exposed region.

The array additionally includes a plurality of word lines which are formed on the isolation material and the contacts so that a word line is formed on the exposed region of each contact in a row of contacts. Each word line includes a layer of dielectric material and an overlying layer of conductive material.

The present invention also includes a segmented antifuse array which is formed on a semiconductor material of a first conductivity type. The array includes a plurality of sub-arrays which each have a plurality of spaced-apart bit lines of a second conductivity type that are formed in the semiconductor material.

Each sub-array also includes a layer of insulation material which is formed on the semiconductor material over the bit lines. The layer of insulation material has a plurality of openings arranged in rows and columns that expose a plurality of bit line regions in each bit line. In addition, a plurality of spaced-apart contacts are formed on the bit line regions such that each contact is connected to an exposed bit line region.

Each sub-array additionally includes a layer of isolation material which is formed over the layer of insulation material and the contacts such that each contact has an exposed region. Further, a plurality of word lines are formed on the isolation material and the contacts so that a word line is formed on the exposed region of each contact in a row of contacts. Each word line includes a layer of dielectric material and an overlying layer of conductive material.

Each sub-array also includes a plurality of drain regions which are formed in the semiconductor material so that a drain region is formed at each end of each bit line. In addition, a plurality of gate oxide regions are formed on the semiconductor material so that a gate oxide region is connected to each drain region.

Each sub-array further includes a plurality of source regions which are formed in the semiconductor material so that a source region is connected to each gate oxide region. In addition, a pair of access lines are formed on the isolation material and the contacts so that an access line is formed on each gate oxide region in a row of gate oxide regions.

A better understanding of the features and advantages of the present invention will be obtained by reference to the following detailed description and accompanying drawings which set forth an illustrative embodiment in which the principles of the invention are utilized.

DETAILED DESCRIPTION

Figure 1:
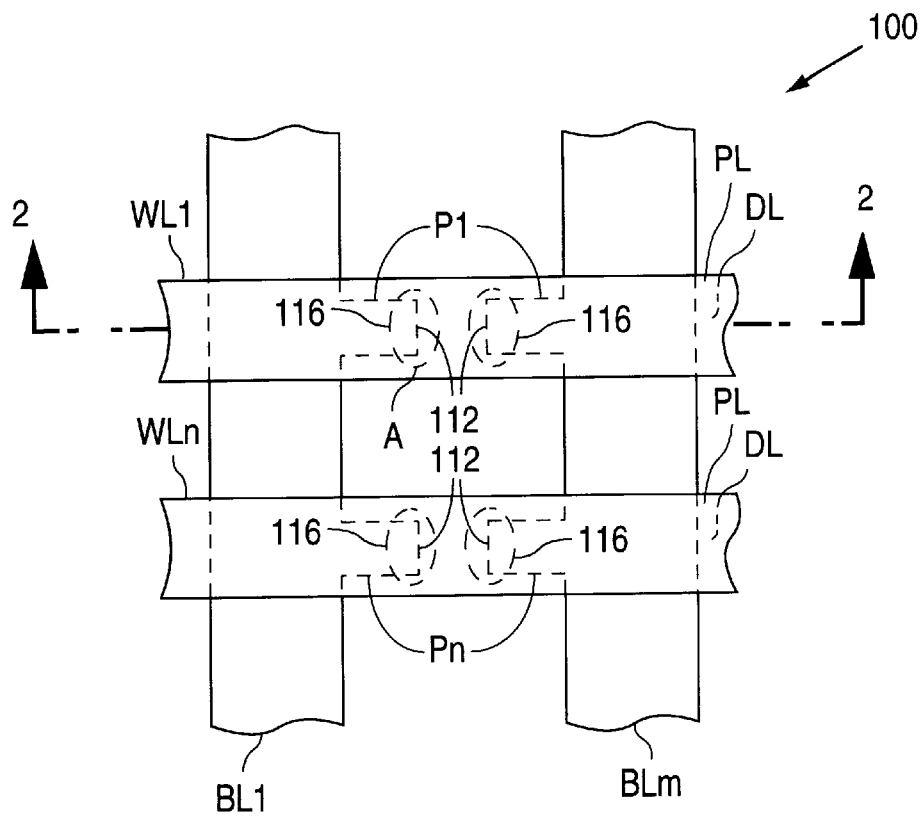
FIG. 1 is a plan drawing illustrating a portion of a conventional antifuse array 100.
Figure 2:
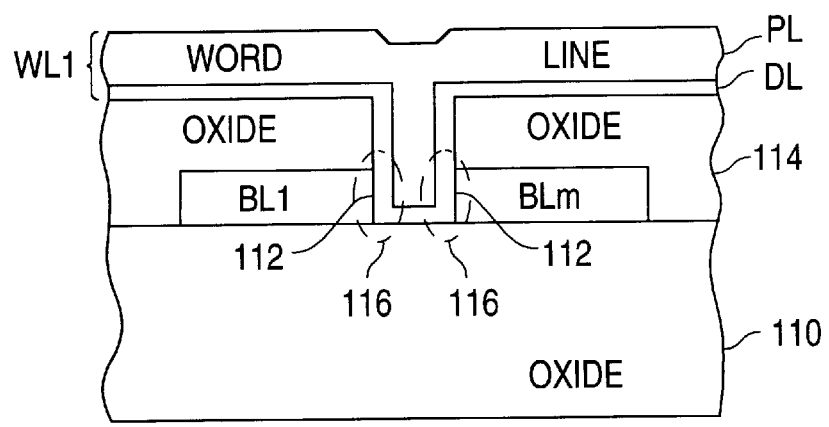
FIG. 2 is a cross-sectional drawing taken along line 2—2 of FIG. 1.
Figure 3A:
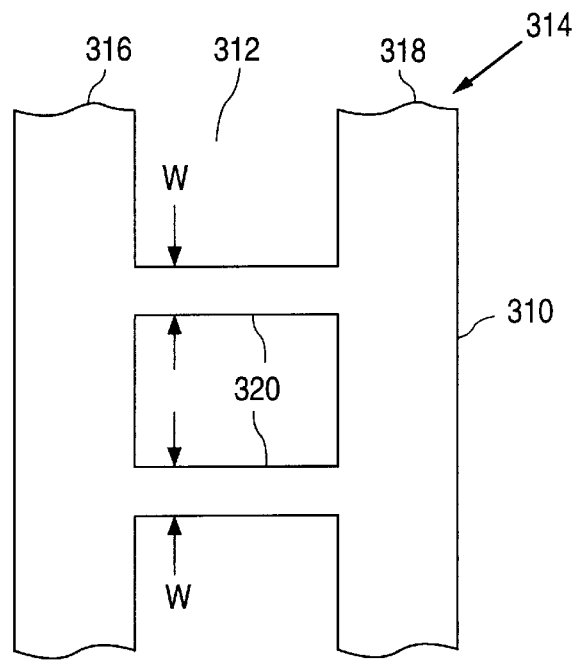
FIGS. 3A–3F are a series of plan views illustrating the fabrication of antifuse array 100.
Figure 3B:
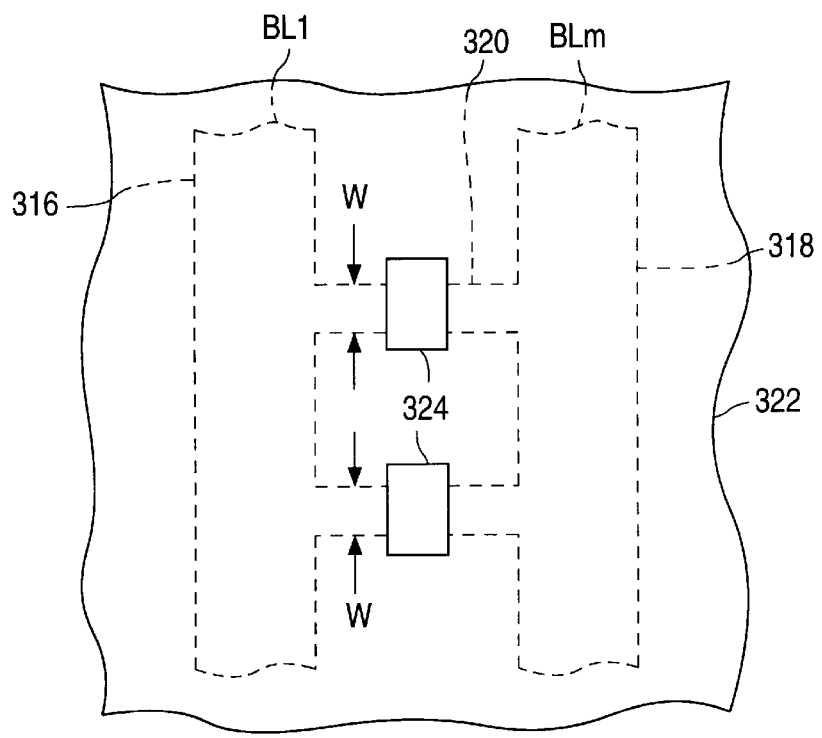
Figure 3C:
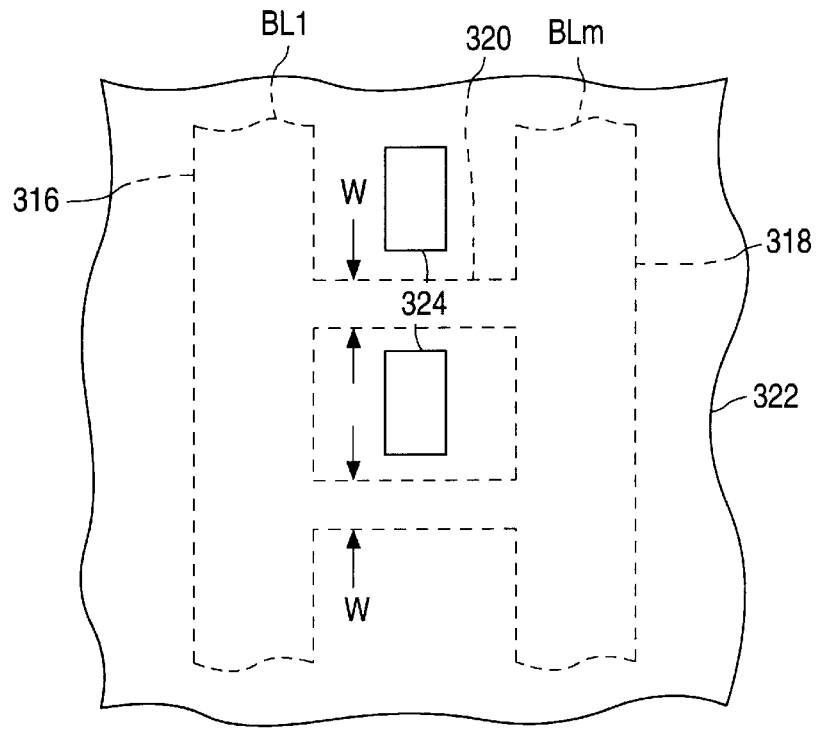
Figure 3D:
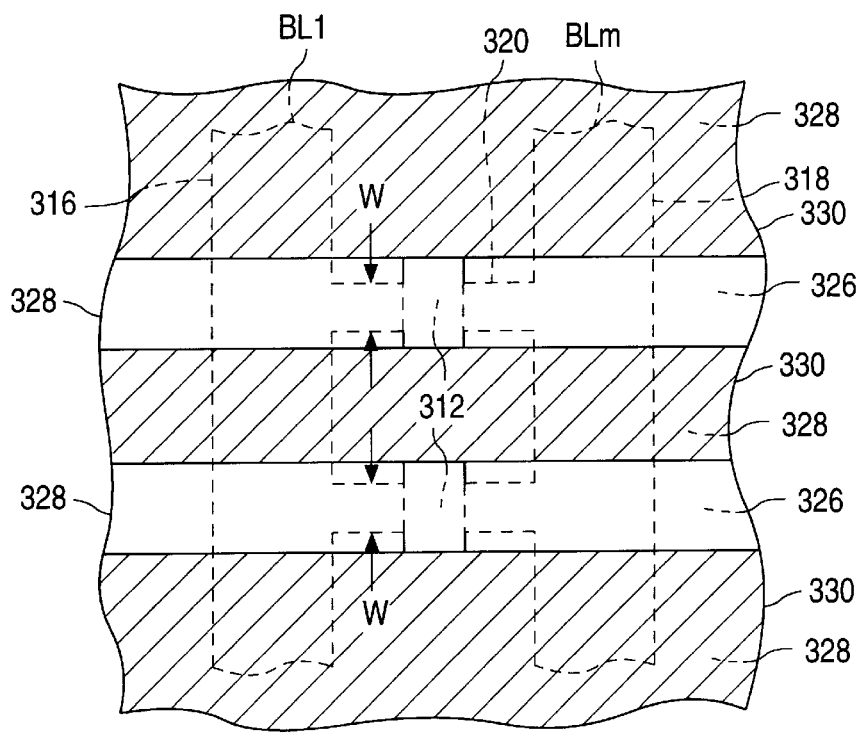
Figure 3E:
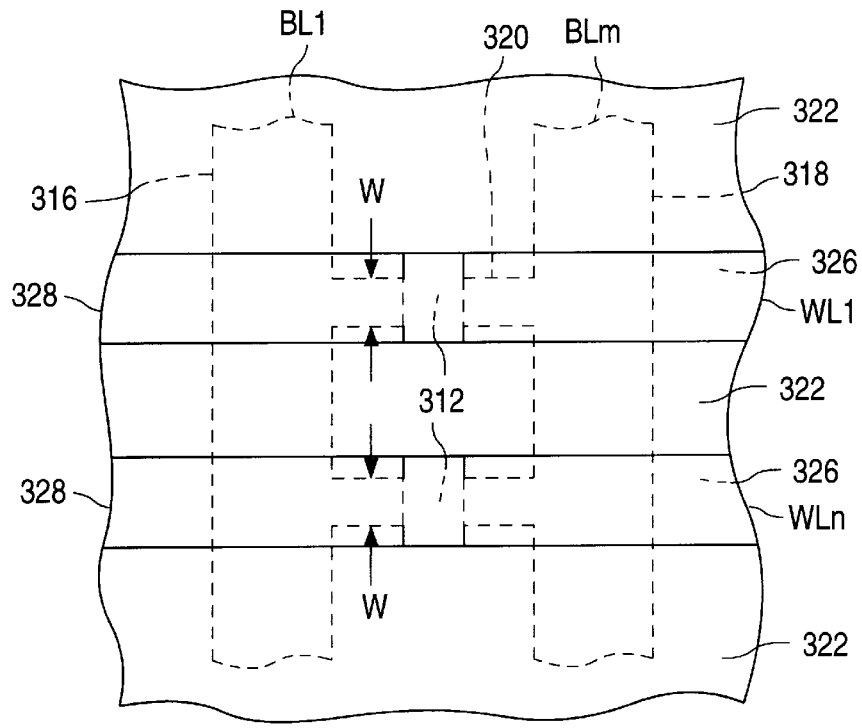
Figure 3F:
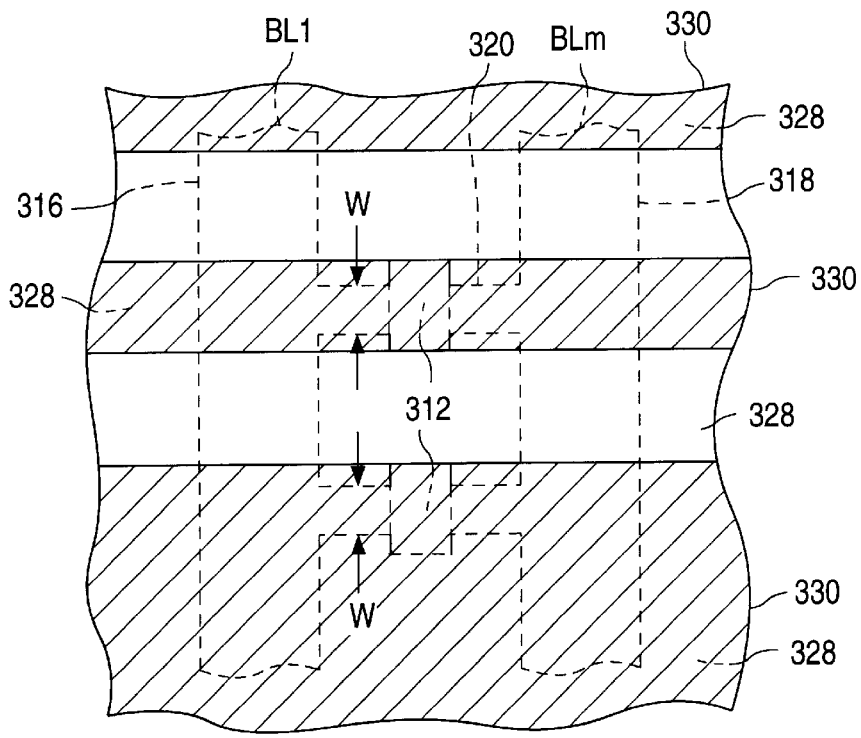
Figure 4A:
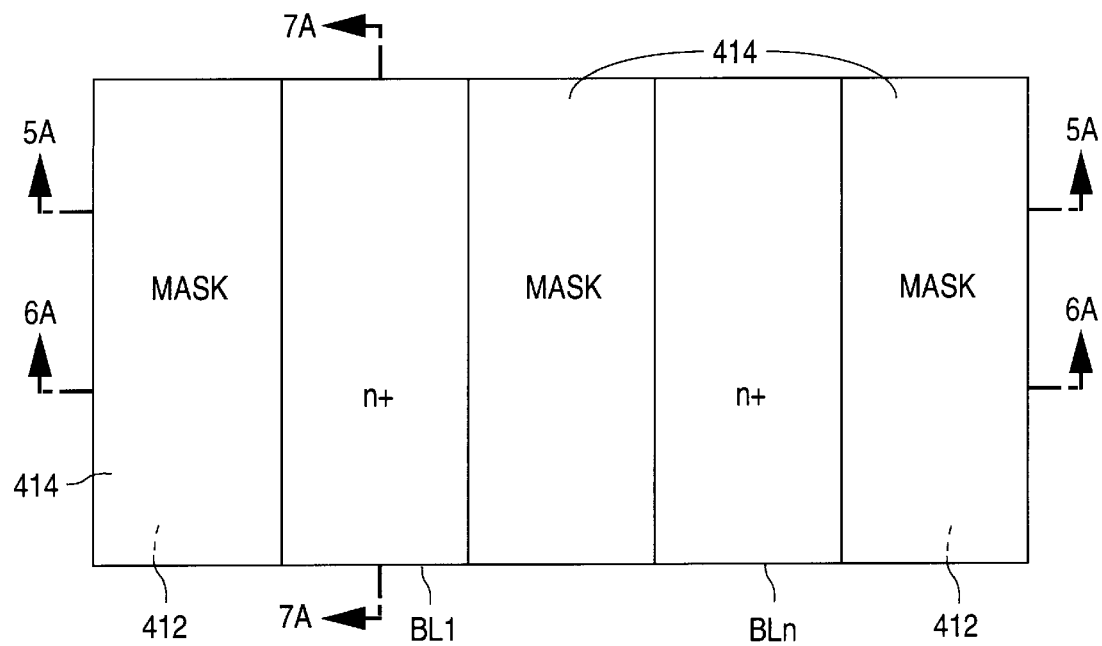
FIGS. 4A–4F are a series of plan views illustrating a method for forming an antifuse array 400 in accordance with the present invention.
Figure 5A:
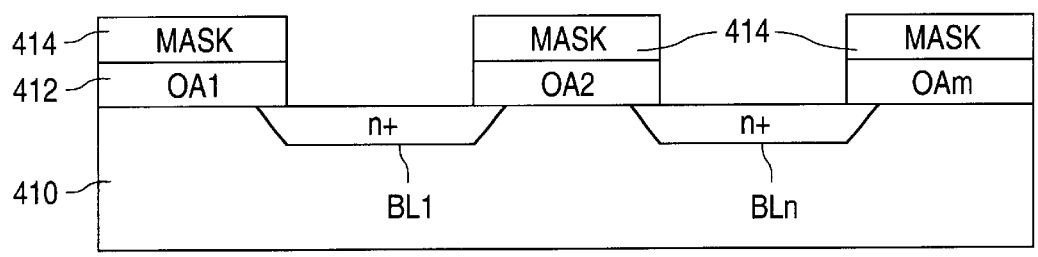
FIGS. 5A–5F are a series of cross-sectional views taken along lines 5A—5A through 5F—5F of FIGS. 4A–4F, respectively.
Figure 6A:
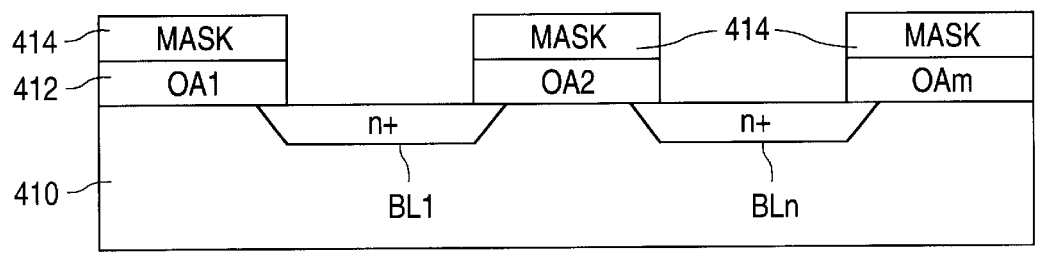
FIGS. 6A–6F are a series of cross-sectional views taken along lines 6A—6A through 6F—6F of FIGS. 4A–4F, respectively.
Figure 7A:
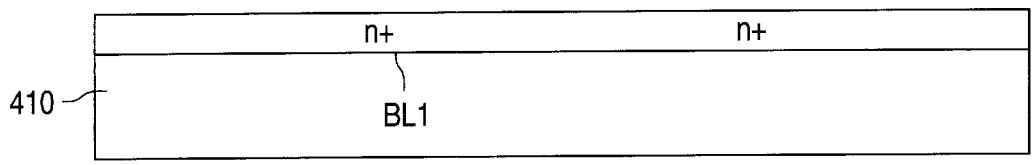
FIGS. 7A–7F are a series of cross-sectional views taken along lines 7A—7A through 7F—7F of FIGS. 4A–4F.
Figure 4B:
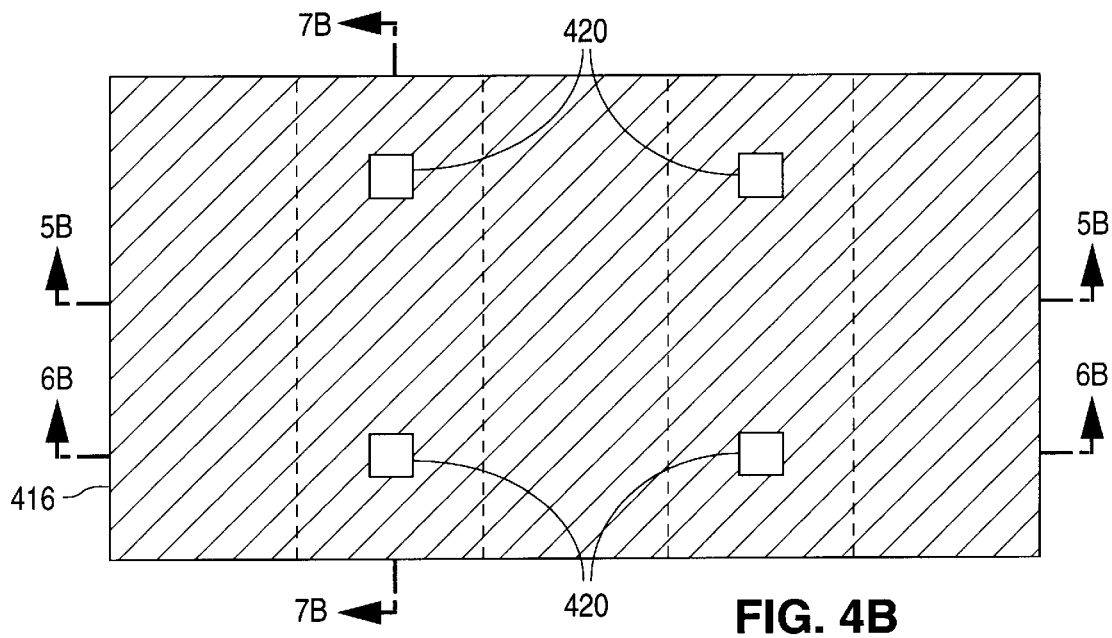
Figure 5B:
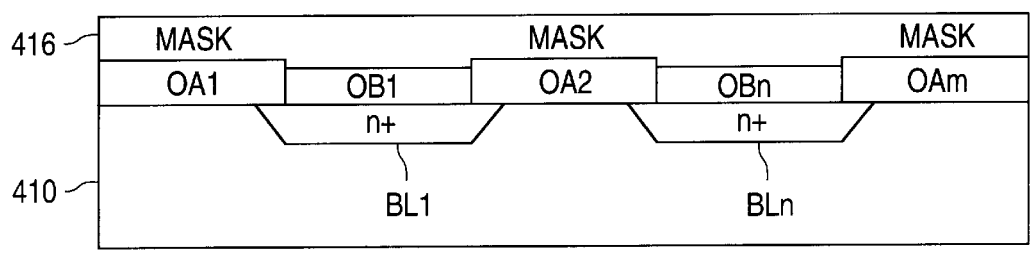
Figure 6B:
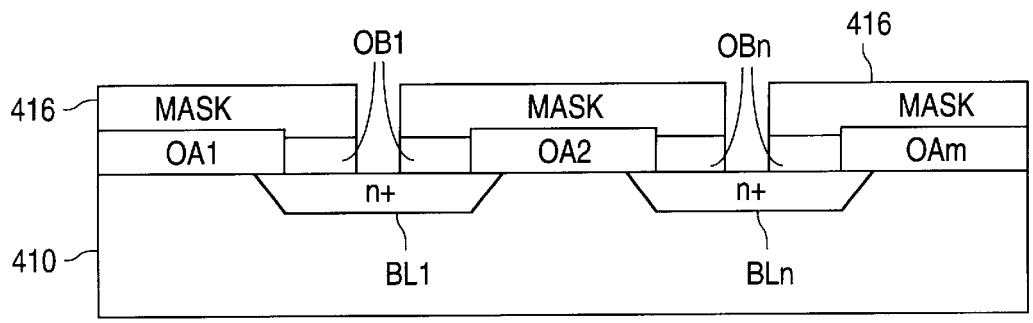
Figure 7B:
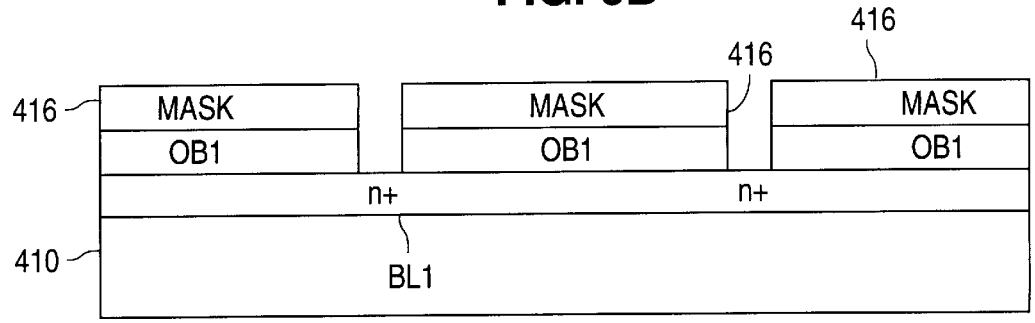
Figure 4C:
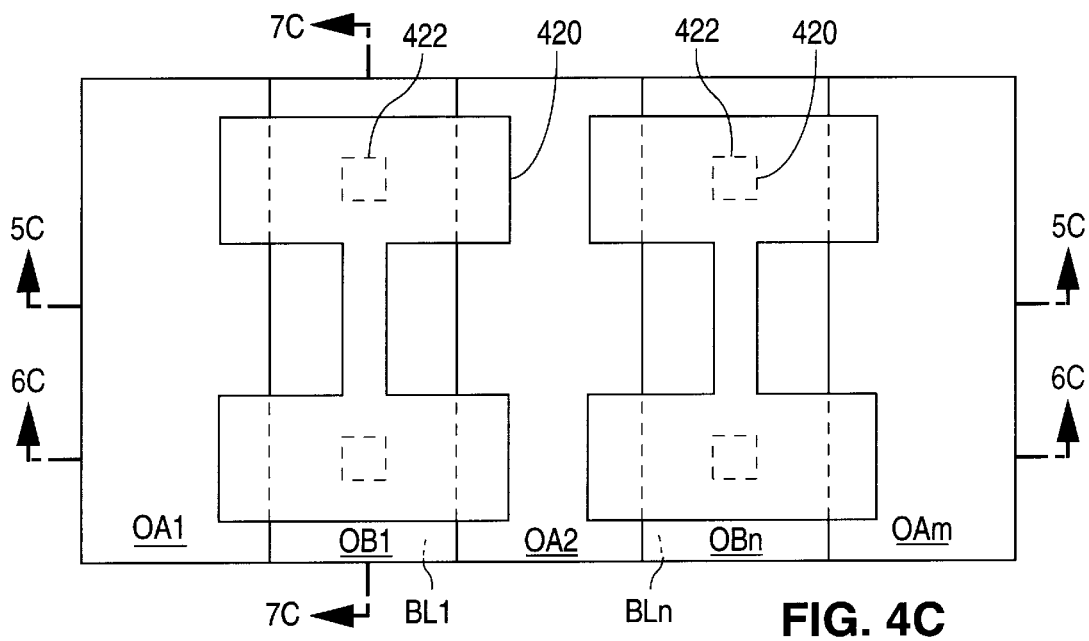
Figure 5C:
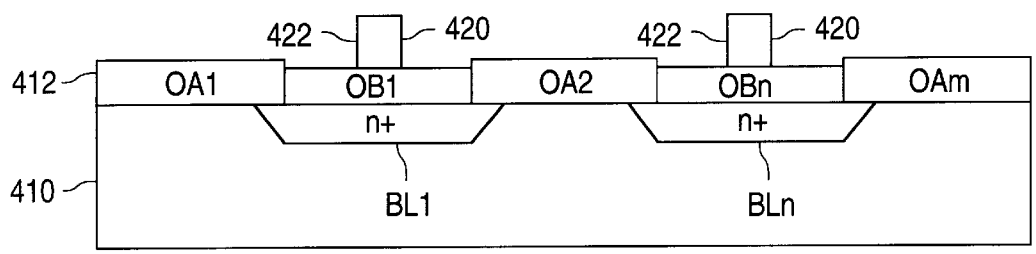
Figure 6C:
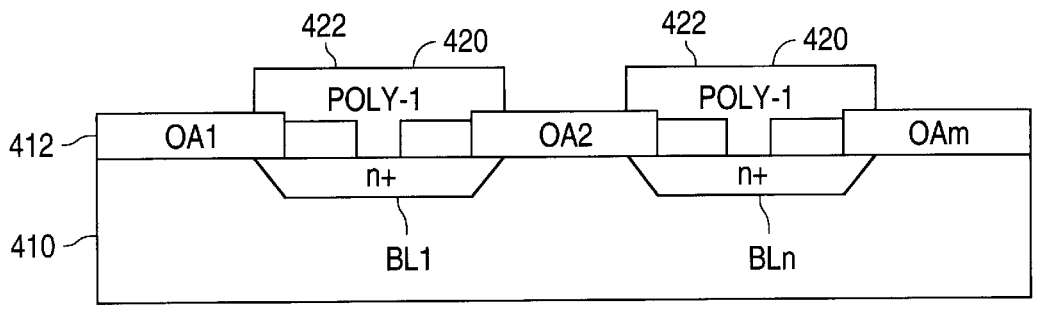
Figure 7C:
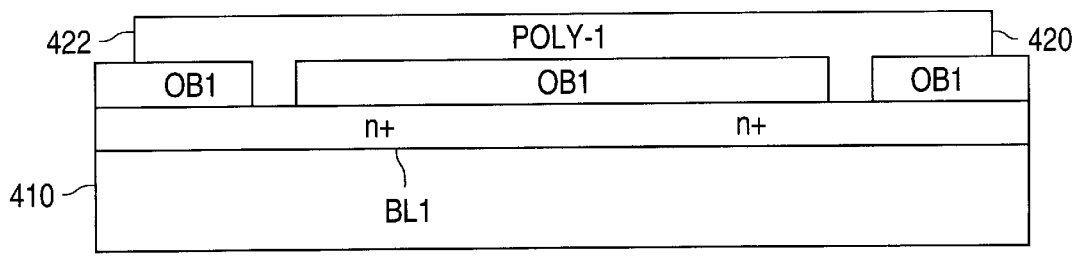
Figure 4D:
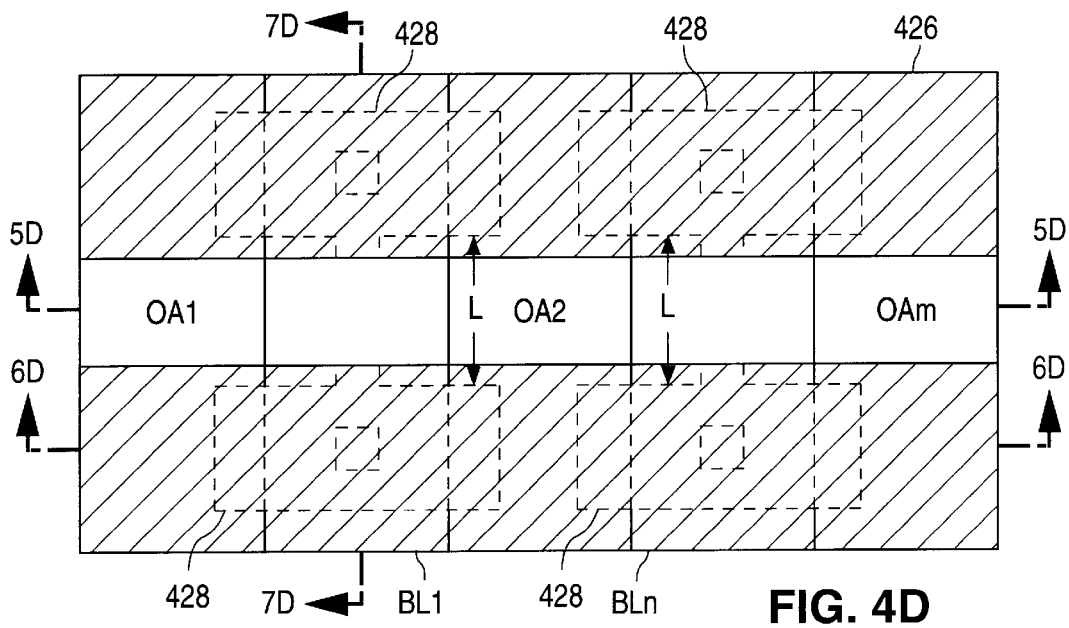
Figure 5D:
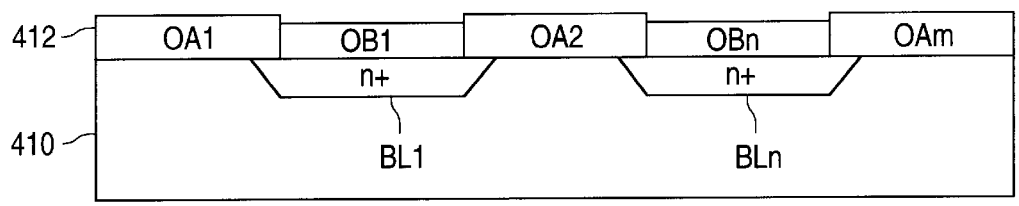
Figure 6D:
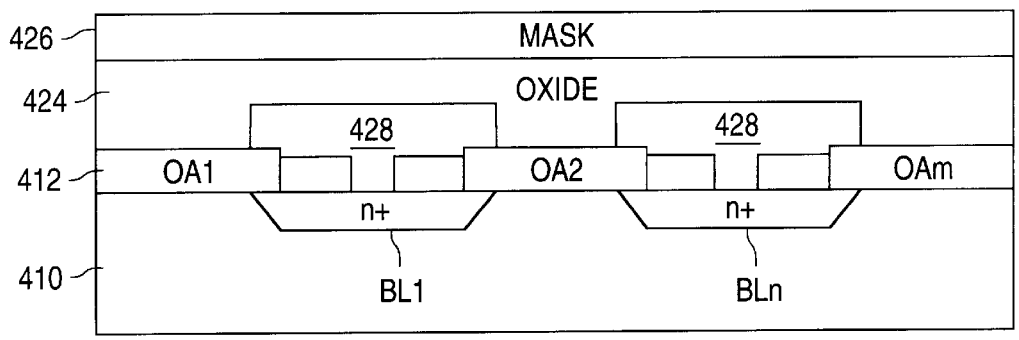
Figure 7D:
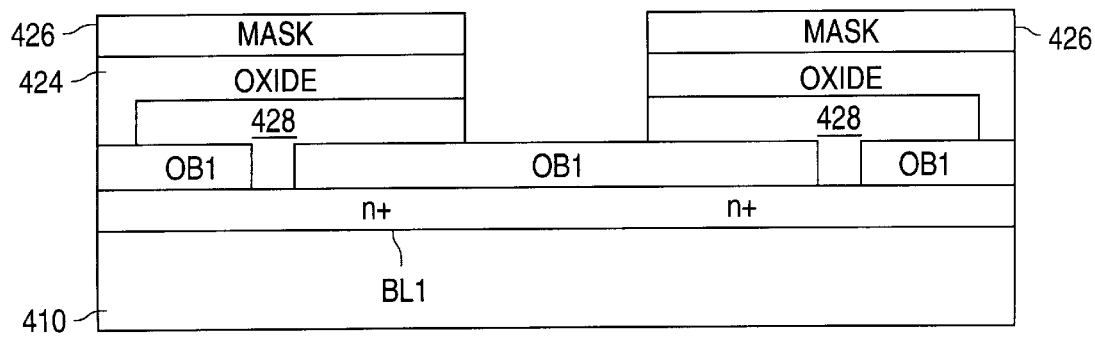
Figure 4E:
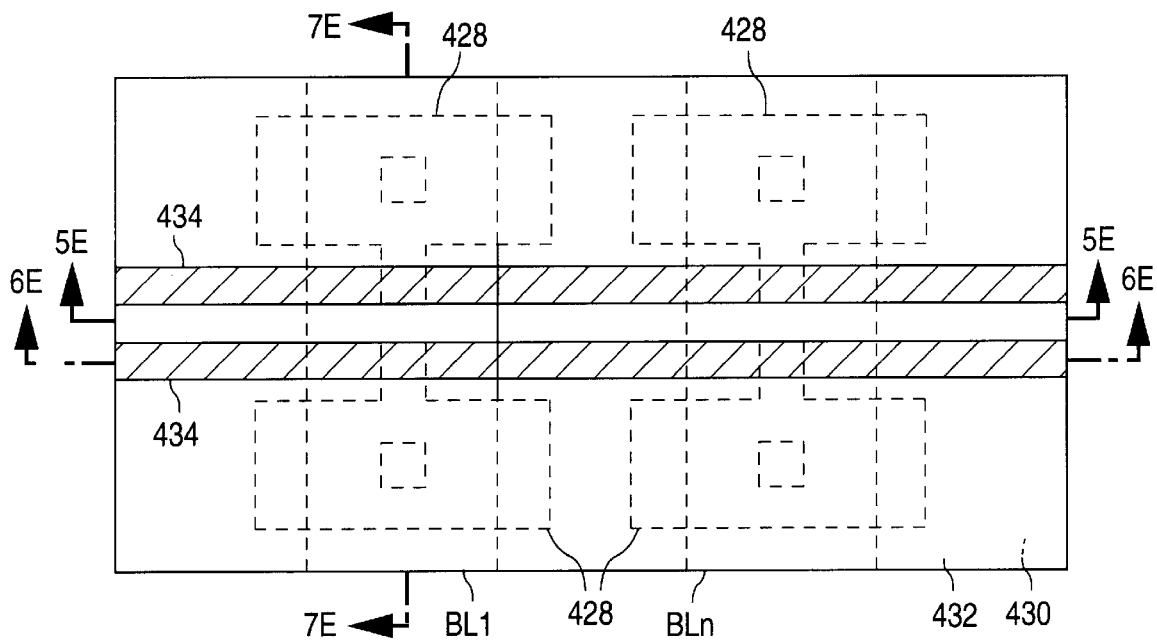
Figure 5E:
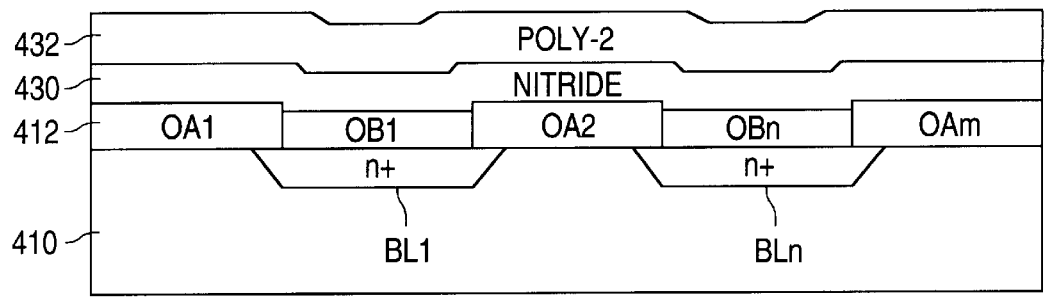
Figure 6E:
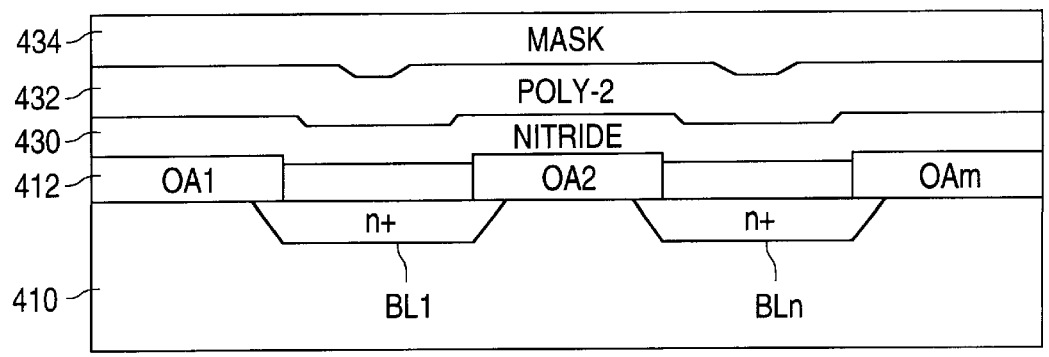
Figure 7E:
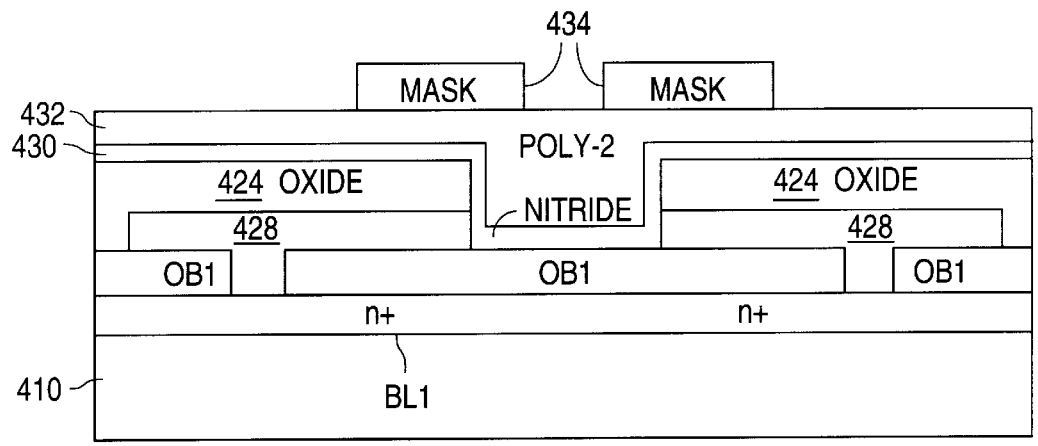
Figure 4F:
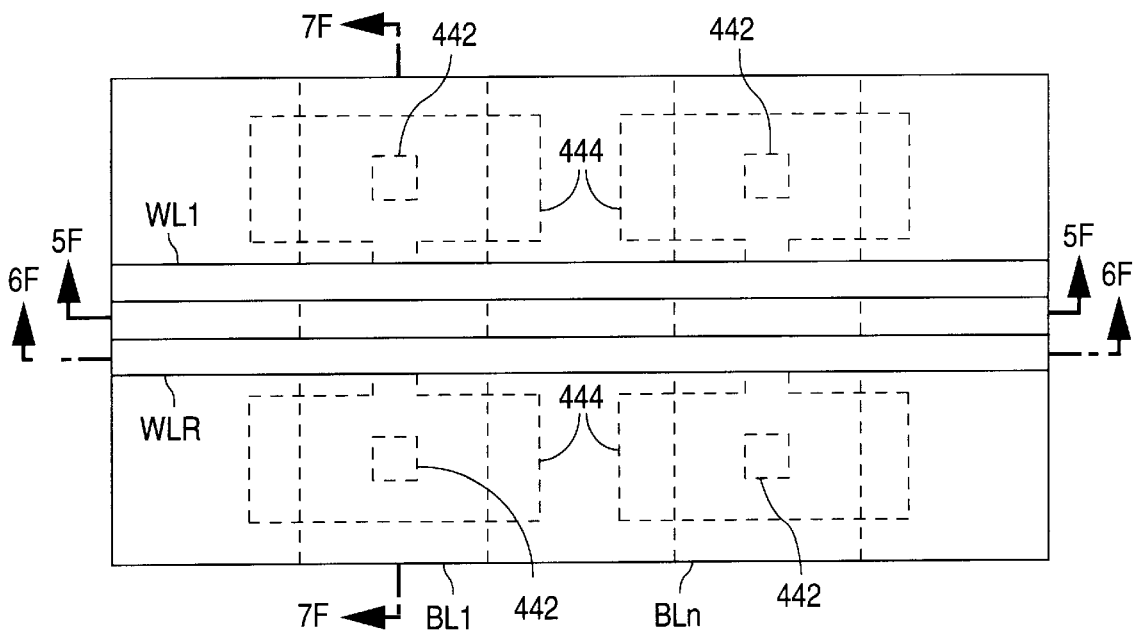
Figure 5F:
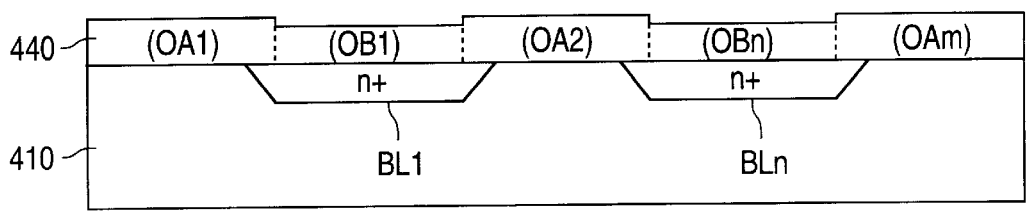
Figure 6F:
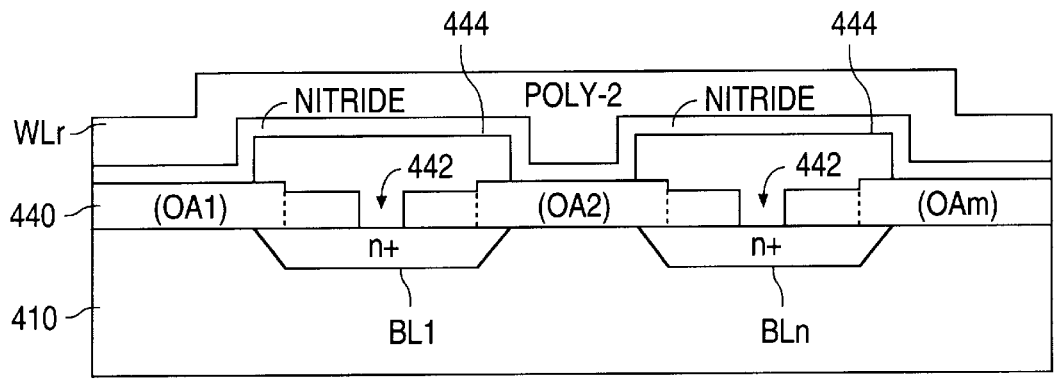
Figure 7F:
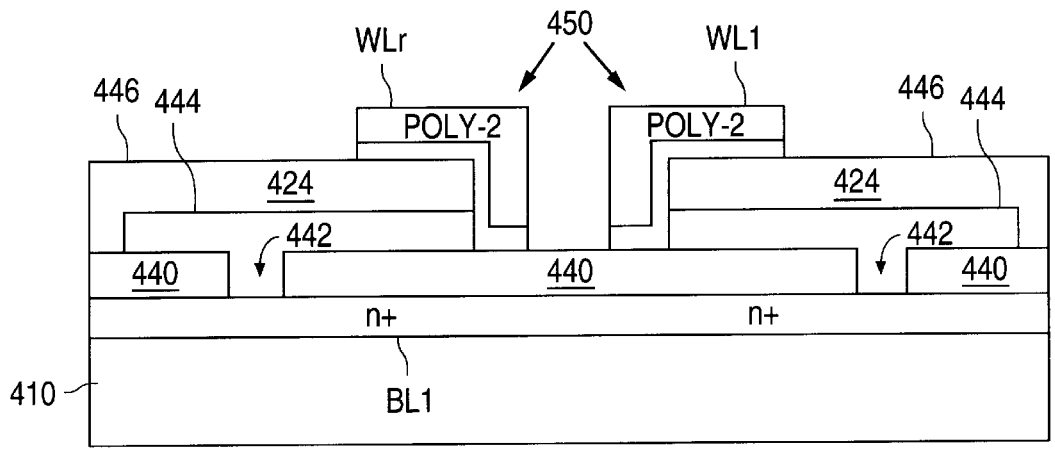

FIGS. 4A–4F show a series of plan views that illustrate a method for forming an antifuse array 400 in accordance with the present invention. FIGS. 5A–5F show a series of cross-sectional views taken along lines 5A—5A through 5F—5F of FIGS. 4A–4F, respectively.

FIGS. 6A–6F show a series of cross-sectional views taken along lines 6A—6A through 6F—6F of FIGS. 4A–4F, respectively. FIGS. 7A–7F show a series of cross-sectional views taken along lines 7A—7A through 7F—7F of FIGS. 4A–4F.

As shown in FIGS. 4A, 5A, 6A, and 7A, the method of the present invention begins by forming a layer of oxide 412 approximately 800Å thick on a semiconductor material 410, such as a substrate or a well, and then forming a bit line mask 414 on oxide layer 412. The unmasked regions of oxide layer 412 are then etched to form a series of oxide strips OA1–OAm on the surface of material 410.

Following the etch, the surface of material 410 between adjacent oxide strips OA is implanted with an n-type dopant, such as arsenic or phosphorous, to form a series of n+ bit lines BL1–BLn in material 410. After this, bit line mask 414 is removed.

Next, as shown in FIGS. 4B, 5B, 6B, and 7B, a series of oxide strips OB1–OBn approximately 500 Å thick are formed over bit lines BL1–BLn by thermally oxidizing the surface of material 410. This step also increases the thickness of oxide strips OA1–OAm, activates the implanted dopant, and anneals lattice damage caused by the implant.

After this, a contact mask 416 is formed on oxide strips OA1–OAm and OB1–OBn to define rows and columns of bit line contact openings 420 over the bit lines BL1–BLn. One of the advantages of the present invention is that mask 416 can be reliably aligned so that openings 420 in mask 416 are over bit lines BL1BLn.

With respect to horizontal alignment, since oxide strips OA1–OAm are thicker than oxide strips OB1–OBn, openings 420 in mask 416 need only be positioned between adjacent oxide strips OA to be over the bit lines BL. With respect to vertical alignment, since bit lines BL1–BLn run vertically, openings 420 in mask 416 will continue be over the bit lines BL even if mask 416 is vertically misaligned.

Once contact mask 416 has been formed, the unmasked regions of oxide strips OB1–OBn are etched to expose the underlying surfaces of bit lines BL1–BLn. Following this, mask 416 is removed.

Next, as shown in FIGS. 4C, 5C, 6C, and 7C, a layer of first polysilicon (poly-1) 420 is formed on oxide strips OA1–OAm and OB1–OBn and the exposed surfaces of bit lines BL1–BLn. After poly-1 layer 420 has been formed, a poly-1 mask (not shown) is formed on poly-1 layer 420. The poly-1 mask may also be reliably positioned for the same reasons that mask 416 can be reliably positioned.

Once the poly-1 mask has been formed, the unmasked regions of poly-1 layer 420 are etched to form a plurality of first contacts 422. Following this, the poly-1 mask is removed.

Next, as shown in FIGS. 4D, 5D, 6D, and 7D, a layer of oxide 424 approximately 1000 Å thick is formed over first contacts 422 and the exposed regions of oxide strips OA1–OAm and OB1–OBn. After this, an antifuse window mask 426 is formed on oxide layer 424 over a middle region of each of the first contacts 422 in a row of first contacts.

Mask 426 may also be reliably positioned. As shown, the length L of the middle region may be set to whatever length is needed to accommodate the vertical misalignment tolerance of the fabrication process that is used.

Once mask 426 has been formed, the unmasked regions of oxide layer 424 and the underlying poly-1 layer of the first contacts 422 are etched to form a plurality of second contacts 428 from the first contacts 422. Following this, mask 426 is removed.

As shown in FIGS. 4E, 5E, 6E, and 7E, after mask 426 has been removed, a layer of nitride 430 is formed on the exposed regions of oxide strips OA1–OAm and OB1–OBn, oxide layer 424, and the exposed sidewalls of the second contacts 428. Once nitride layer 430 has been formed, a second layer of polysilicon (poly-2) 432 is formed over nitride layer 430. Next, a poly-2 mask 434 is formed over poly-2 layer 432.

As shown in FIGS. 4F, 5F, 6F, and 7F, once mask 434 has been formed, the unmasked regions of poly-2 layer 432 and the underlying layer of nitride 430 are etched to form a series of word lines WL1–WLr. Following the formation of the word lines WL1–WLr, mask 434 is removed. The word lines WL1–WLr are then doped to have an n-type conductivity. After this, the process continues with conventional steps.

Figure 8:
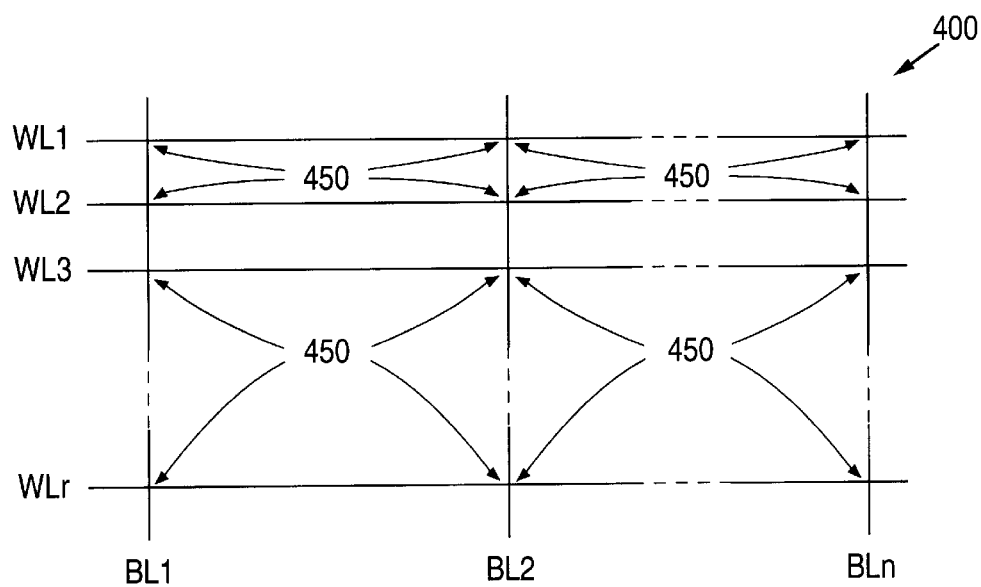
FIG. 8 is a schematic view illustrating antifuse array 400 in accordance with the present invention.

Thus, as shown in FIGS. 4F, 5F, 6F, and 7F, and as further shown in FIG. 8, which shows a schematic view, antifuse array 400 includes a plurality of spaced-apart bit lines BL1–BLn which are formed in a semiconductor material 410, such as a substrate or a well, and a layer of insulation material 440 which is formed on bit lines BL1–BLn.

As shown, insulation layer 440 has a plurality of contact openings 442 which expose portions of the underlying bit lines BL1–BLn. The contact openings 442 are formed in rows and columns so that each bit line BL has a contact opening 442 for each row. Insulation layer 440 may include oxide lines OA1–OAm and OB1–OBn as shown in FIGS. 4F–7F, or other insulation materials alone or in combination.

Further, array 400 also includes a plurality of contact plates 444 which are formed on the exposed portions of the bit lines BL1–BLn such that a contact plate 440 is formed over every contact opening. In addition, each contact plate 444 has an exposed sidewall.

Array 400 further includes a layer of isolation material 446 which is formed on the layer of insulation material 440 and the contact plates 444. Isolation layer 446 may include oxide layer 424 as shown in FIGS. 4F–7F, or other isolation materials alone or in combination.

Array 400 additionally includes a plurality of spaced-apart word lines WL1–WLr which are formed so that each word line WL contacts all of the exposed sidewalls of the contact plates 444 in a row of contact plates. Each word line includes a layer of dielectric material and an overlying layer of conductive material such as doped polysilicon.

An antifuse 450 is formed at each location where a word line WL contacts a bit line BL. In a row of antifuses 450, each bit line BL functions as the lower plate of an antifuse, while the word line WL formed over the bit line functions as the upper plate.

In operation, a row of antifuses is programmed by applying a first voltage to the word line WL that is connected to the row of antifuses to be programmed, and a second voltage to each bit line BL that is connected to each antifuse 450 in the row of antifuses to be programmed such that first and second voltages are sufficient to establish the necessary electric field.

For example, if a positive programming voltage is used as the first voltage, then ground can be used as the second voltage. If ground is used as the first voltage, then the positive programming voltage can be used as the second voltage.

In addition, if a positive voltage is used as the first voltage, then the necessary electric field can be established by using a negative voltage as the second voltage. Similarly, if the first voltage is negative, then a positive voltage can be used as the second voltage.

Figure 9:
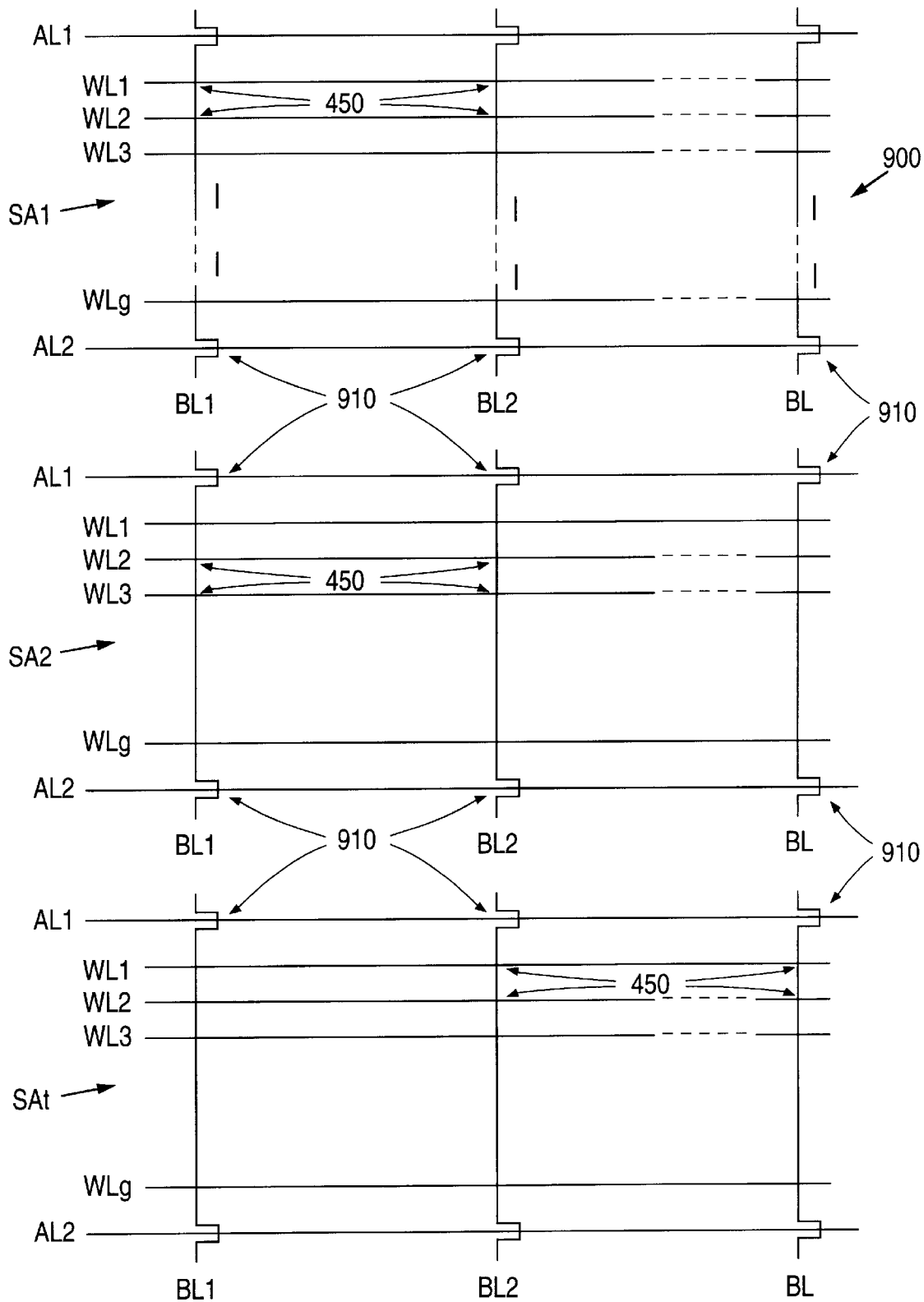
FIG. 9 is a schematic diagram illustrating a segmented antifuse array 900 in accordance with the present invention.
Figure 11A:
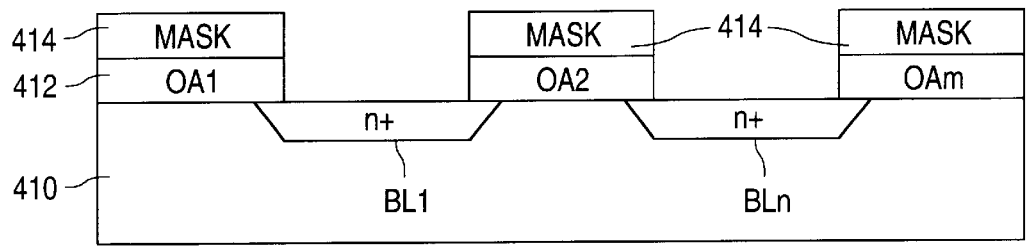
FIGS. 11A–11D are a series of cross-sectional views taken along lines 11A—11A through 11D—11D of FIGS. 10A–10D, respectively.
Figure 12A:
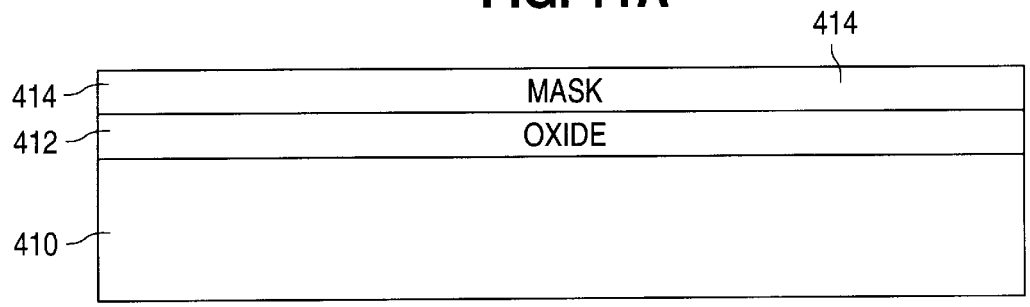
FIGS. 12A–12D are a series of cross-sectional views taken along lines 12A—12A through 12D—12D of FIGS. 10A–10D, respectively.
Figure 13A:
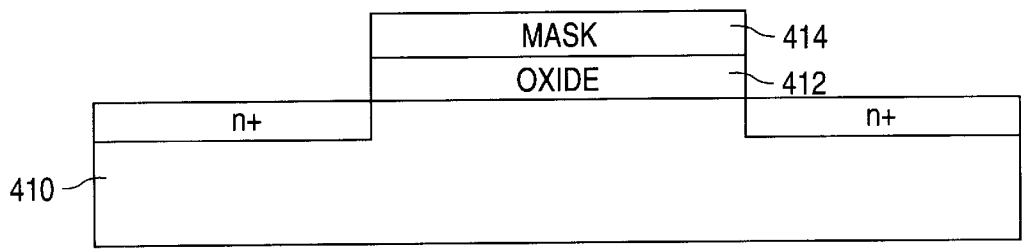
FIGS. 13A–13D are a series of cross-sectional views taken along lines 13A—13A through 13D—13D of FIGS. 10A–10D.

In an alternate embodiment of the present invention, array 400 can be segmented to increase the speed of the array. FIG. 9 shows a schematic diagram that illustrates a segmented antifuse array 900 in accordance with the present invention.

As shown in FIG. 9, array 900 includes a plurality of sub-arrays SA1–SAt. Each sub-array SA is similar to array 400 and, as a result, utilizes the same reference numerals to designate the structures which are in common.

Each sub-array SA differs from array 400 in that each sub-array SA has fewer antifuses 450 in each column of antifuses and, thus, fewer word lines WL. By reducing the number of antifuses 450 in a column of antifuses, the bit line capacitance is reduced which, in turn, increases the speed of the array.

As further shown in FIG. 9, each sub-array SA also includes a plurality of access transistors 910 which are formed in rows and columns so that an access transistor 910 is formed at each end of each bit line BL in each sub-array SA. While the drains of the access transistors 910 are connected to the bit lines BL, the sources of the transistors 910 are connected to current sense circuits (not shown).

In addition to the above, each sub-array SA further includes a pair of access lines AL1 and AL2 which are formed so that an access line AL is connected to the gate of each access transistor 910 in a row of access transistors 910.

In operation, when a selected row of antifuses is to be read, an access voltage is applied to the access lines AL that are connected to the bit lines BL that are connected to the row of antifuses. This turns on the access transistors 910 positioned at each end of the bit lines BL.

When a read voltage is then applied to the word line WL that corresponds with the selected row of antifuses, a read current flows from the word line WL, through the antifuse, and out through the sources of the access transistors 910. (No current flows if the dielectric associated with the antifuse is intact.) For example, if the first row of antifuses is to be read, an access voltage is applied to access lines AL1 and AL2, while a read voltage is applied to word line WL1.

FIGS. 10A–10D show a series of plan views that illustrate a method for forming segmented antifuse array 900 in accordance with the present invention. FIGS. 11A–11D show a series of cross-sectional views taken along lines 11A—11A through 11D—11D of FIGS. 10A–10D, respectively.

FIGS. 12A–12D show a series of cross-sectional views taken along lines 12A—12A through 12D—12D of FIGS. 10A–10D, respectively. FIGS. 13A–13D show a series of cross-sectional views taken along lines 13A—13A through 13D—13D of FIGS. 10A–10D.

Array 900 is formed by modifying the steps used to form array 400. The first modification is to the step that forms mask 414, which is modified so that mask 414 defines a plurality of sub-arrays that each have a series of unmasked strips on the surface of oxide layer 412.

Following this, the unmasked strips of oxide layer 412 are etched to expose strips on the surface of material 410, which are then implanted to form the structure shown in FIGS. 10A, 11A, 12A, and 13A. Following the implant, mask 414 is removed, and the process continues as described above.

Figure 10A:
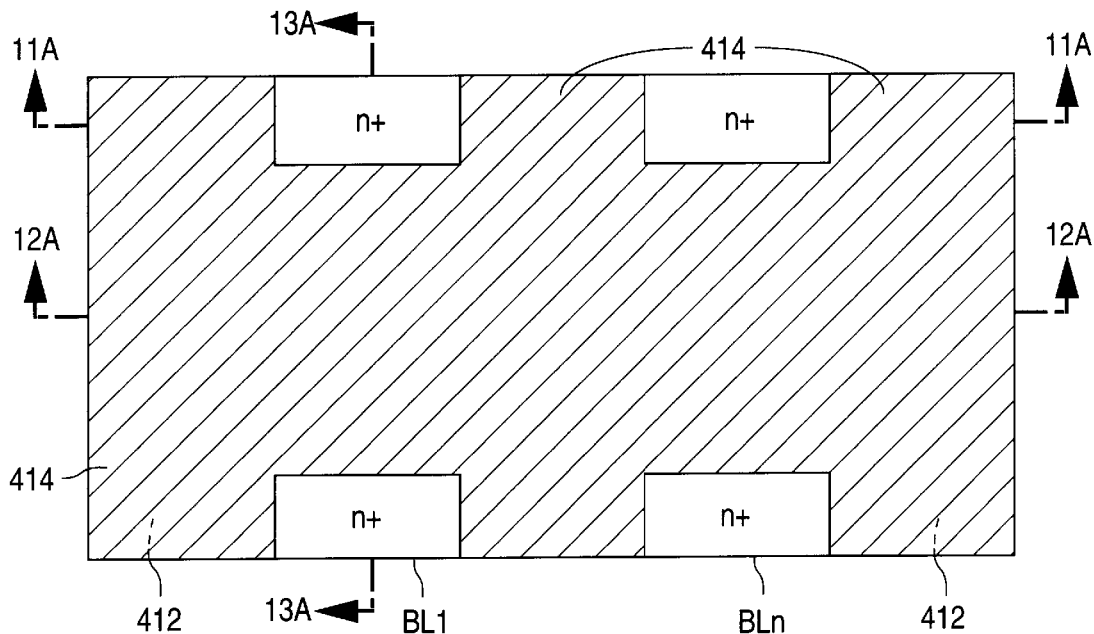
FIGS. 10A–10D are a series of plan views illustrating a method for forming segmented antifuse array 900 in accordance with the present invention.
Figure 10B:
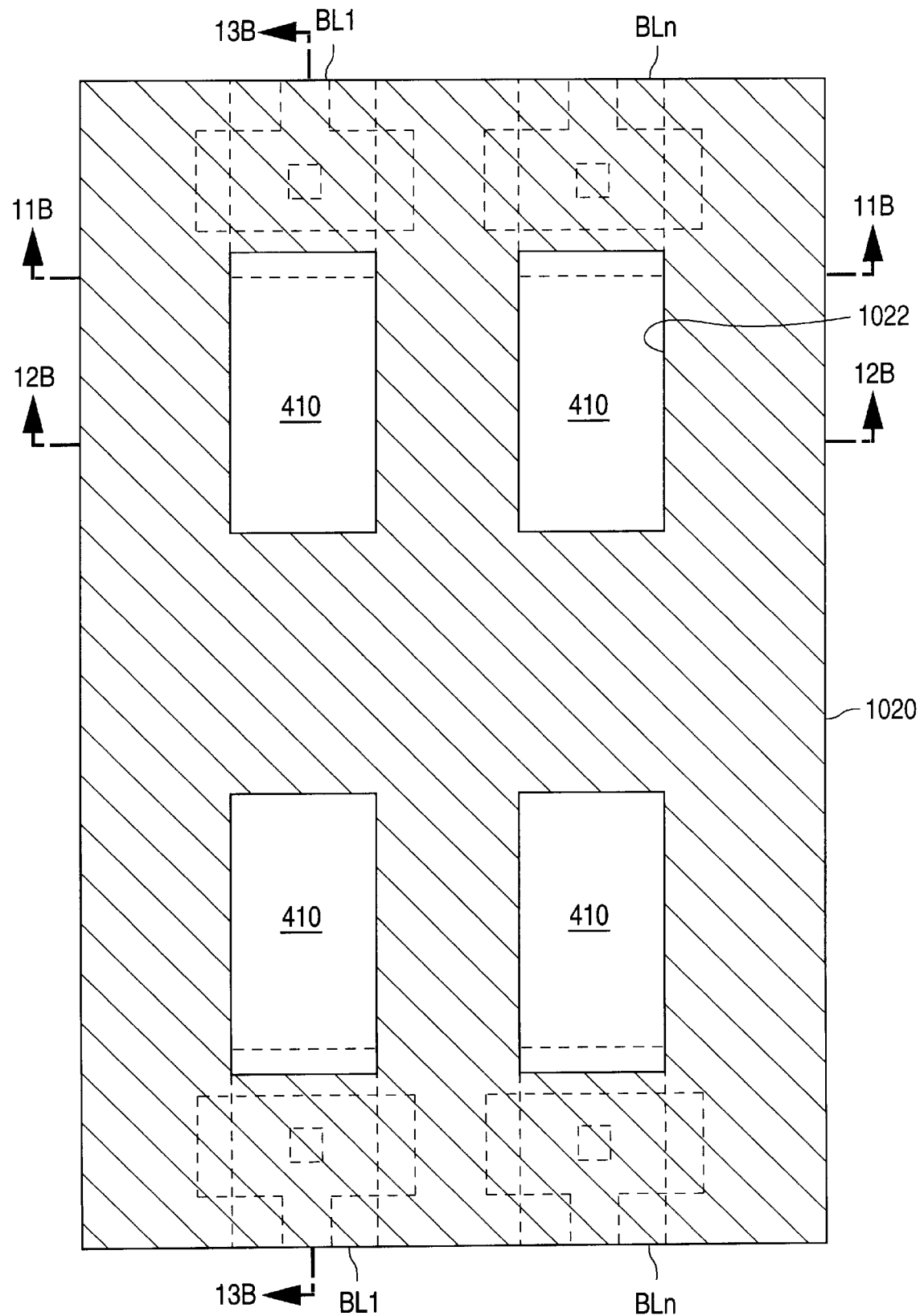
Figure 10C:
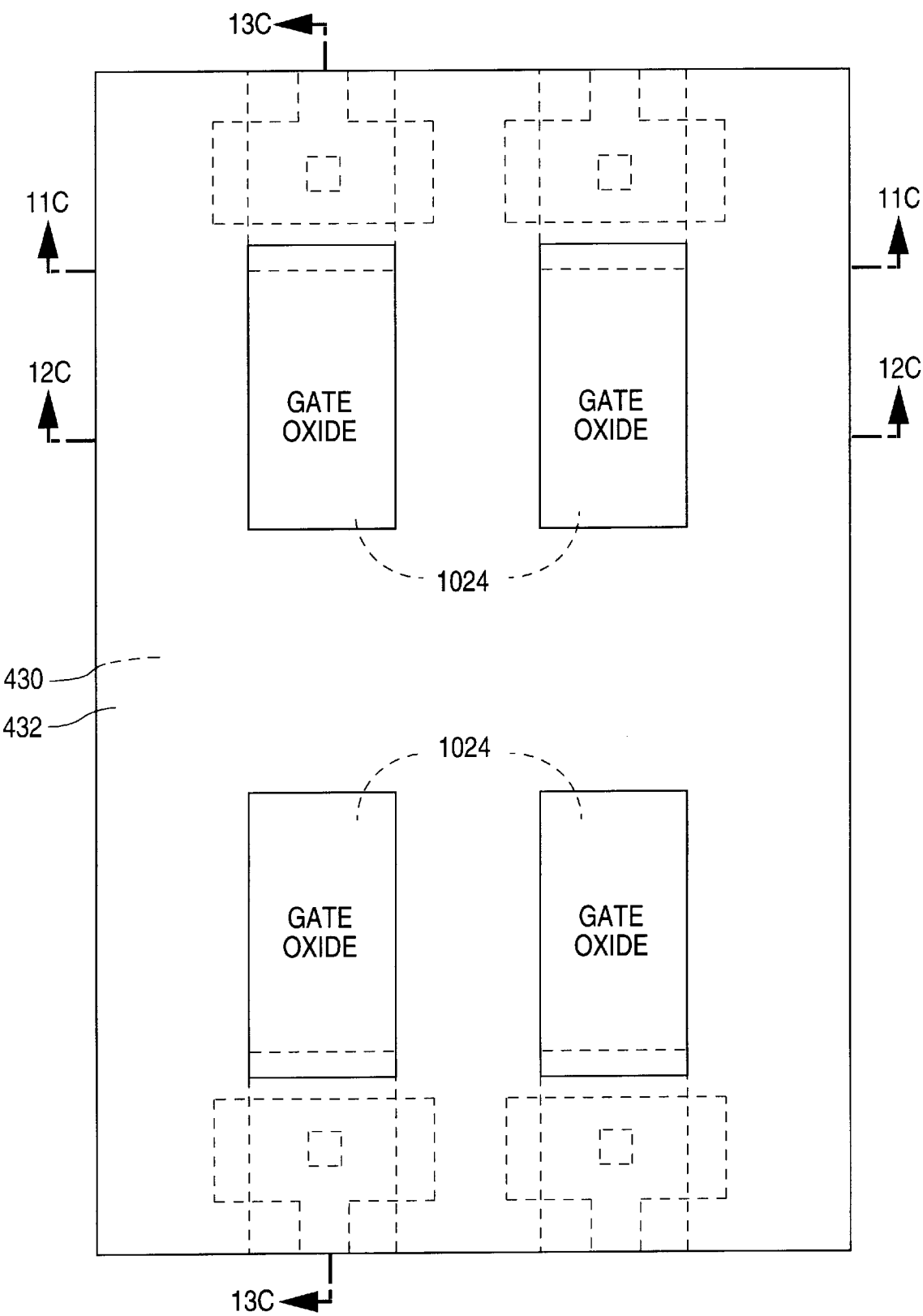
Figure 10D:
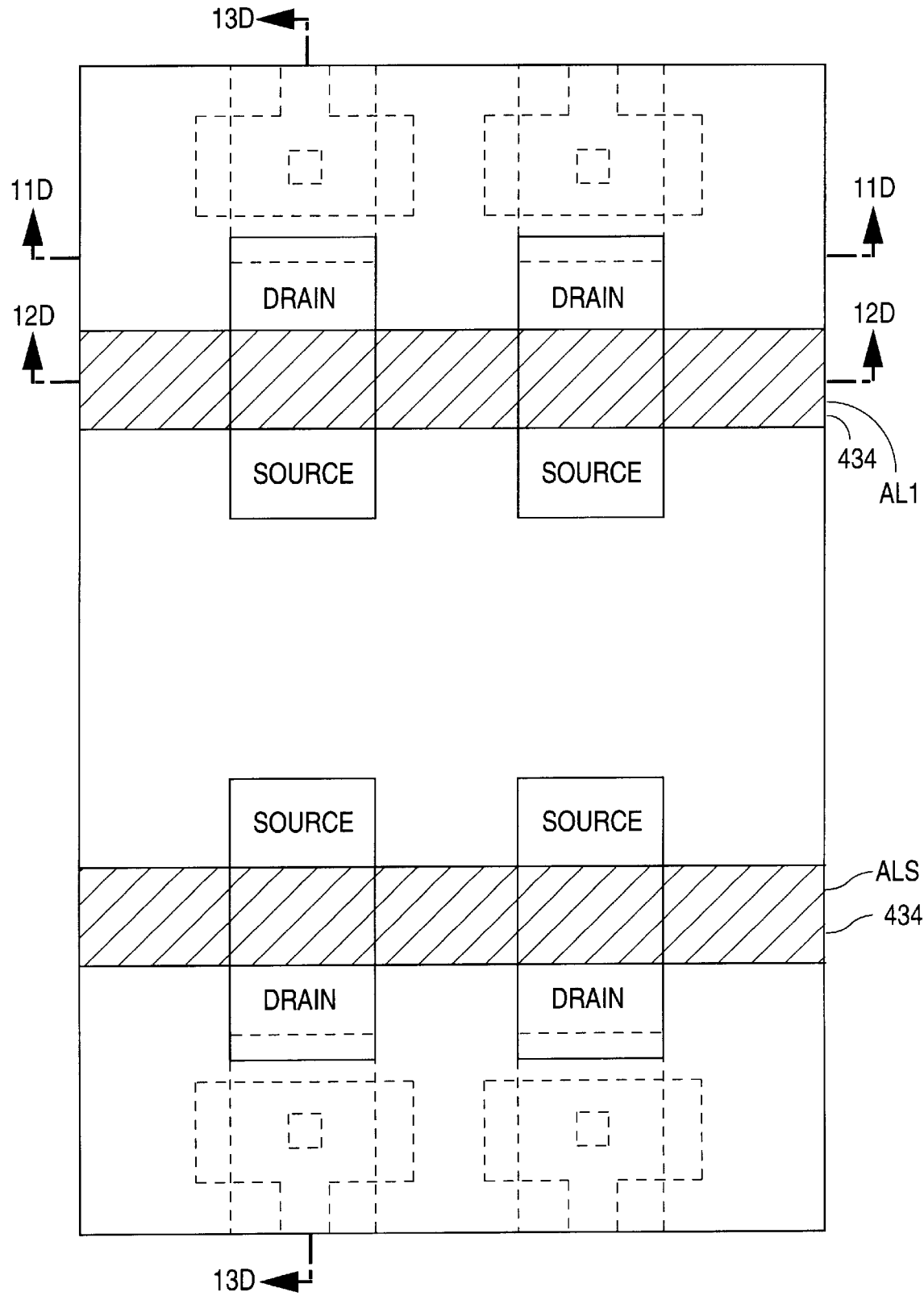
Figure 11B:
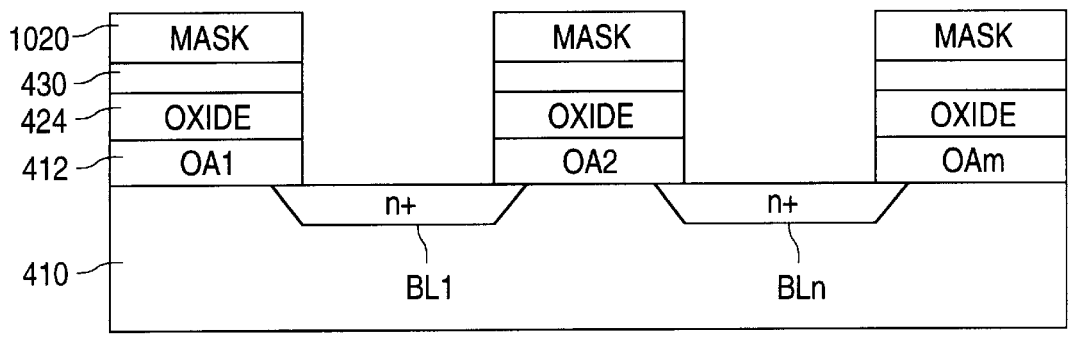
Figure 12B:
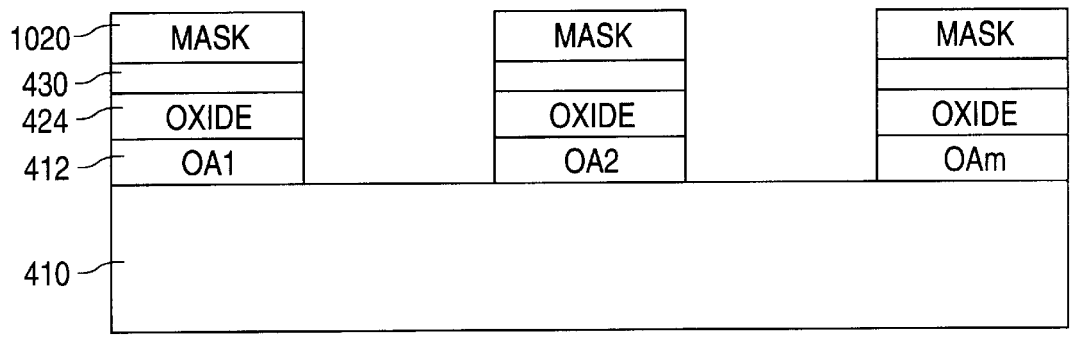
Figure 13B:
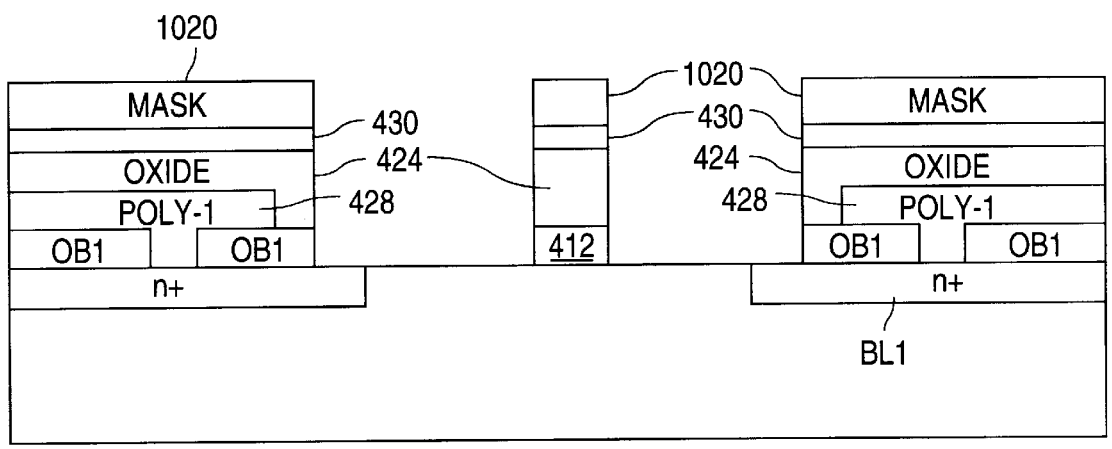
Figure 11C:
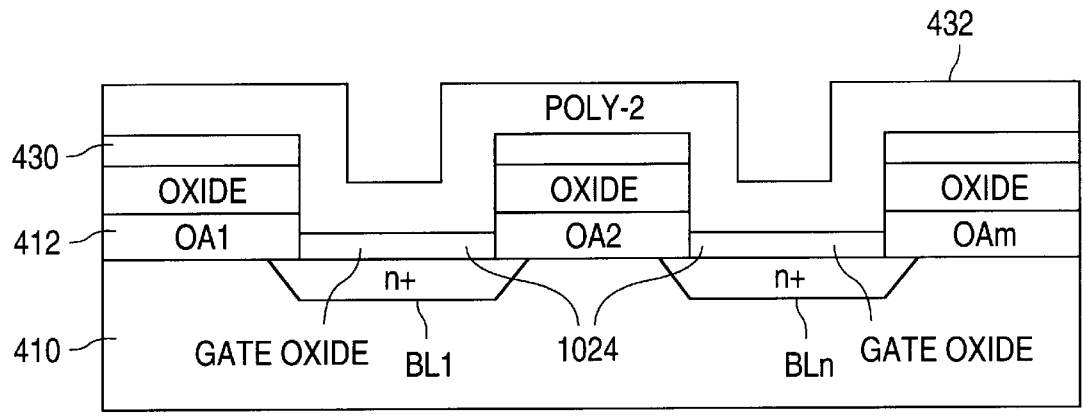
Figure 12C:
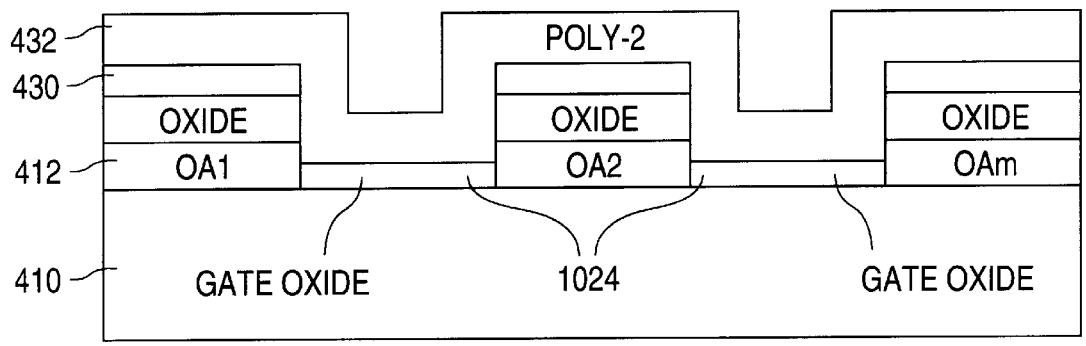
Figure 13C:
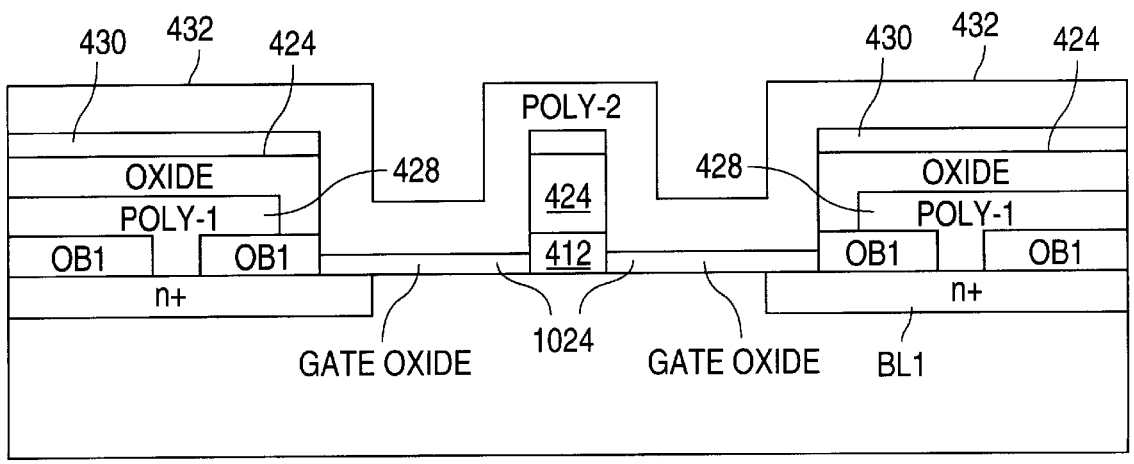
Figure 11D:
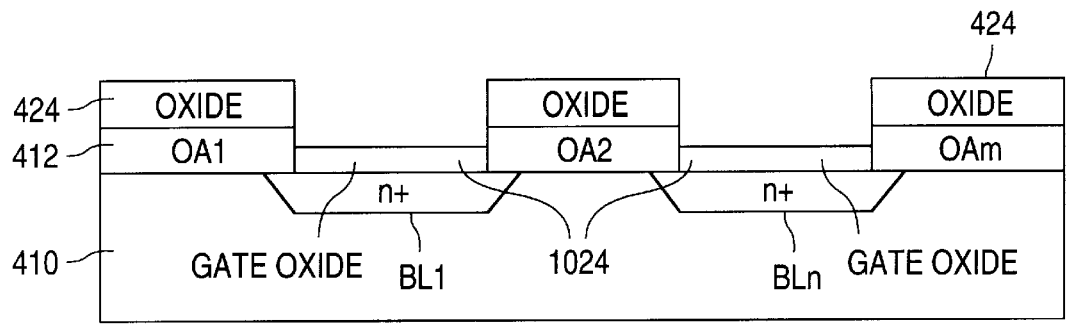
Figure 12D:
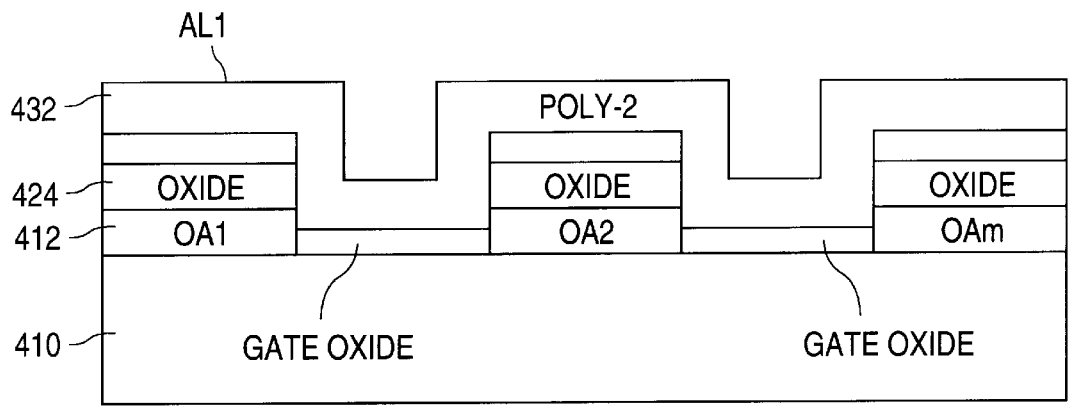
Figure 13D:
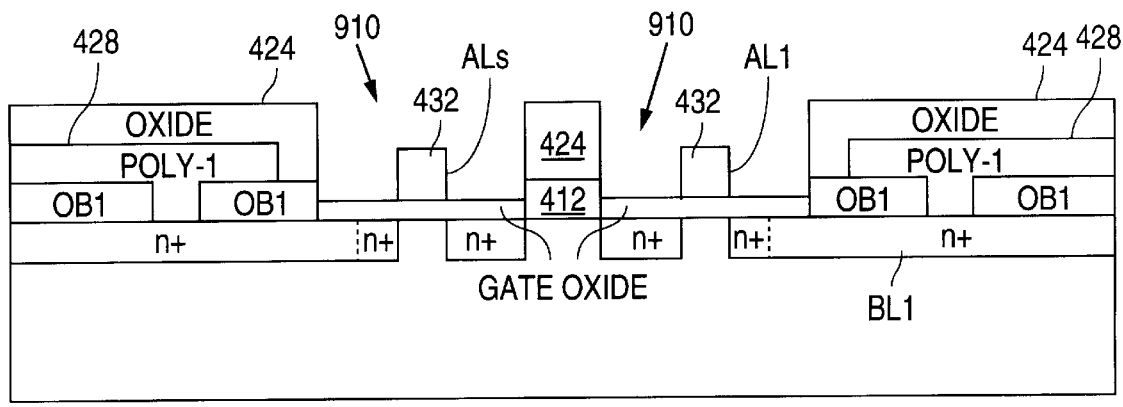

The next modification adds several additional steps following the step that forms nitride layer 430, and precedes the step that forms poly-2 layer 432. As shown in FIG. 10B, following the formation of nitride layer 430, an access transistor mask 1020 is formed an patterned over nitride layer 430.

The unmasked regions of nitride layer 430 and the underlying layers of oxide 424 and regions of oxide strips OB1–OBn are then etched to form a series of transistor openings 1022 that each expose an end of a bit line BL on the surface of material 410. Mask 1020 is then removed.

Following this, as shown in FIGS. 10C, 11C, 12C, and 13C, a layer of gate oxide 1024 is formed on the surface of material 410. The process then reverts to the above-described flow where poly-2 layer 432 is formed over nitride layer 430 and, now also, gate oxide layer 1024.

Next, as shown in FIGS. 10D, 11D, 12D, and 13D, poly-2 mask 434 is modified to also form a series of access lines AL1–ALs along with the series of word lines WL1–WLr. Following the etch that forms word lines WL1–WLr, mask 434 is removed. The word lines WL1–WLr, the access lines AL1–ALs, and the source and drain regions of the access transistors 910 are then doped to have an n+ dopant concentration. (Alternately, an additional mask may be used to limit the dopant concentration of the word and access lines WL1–WLr and AL1–ALs.) After this, the process continues with conventional steps.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. An antifuse array formed on a semiconductor material of a first conductivity type, the array comprising:
   a plurality of spaced-apart bit lines formed in the semiconductor material that extend across the array, the bit lines having a second conductivity type;
   a layer of insulation material formed on the semiconductor material over the bit lines, the layer of insulation material having a plurality of openings that expose a plurality of bit line regions on each bit line, the openings being arranged in rows and columns;
   a plurality of spaced-apart contacts formed on the bit line regions such that each contact is connected to an exposed bit line region;
   a layer of isolation material formed over the layer of insulation material and the contacts such that each contact has an exposed region;
   a plurality of dielectric lines formed on the isolation material and the contacts so that a dielectric line is formed on the exposed region of each contact in a row of contacts, the dielectric lines extending across the array in a direction perpendicular to the bit lines; and
   a plurality of conductive word lines formed on the plurality of dielectric lines to contact the dielectric lines so that a word line is formed on each dielectric line.

2. The array of claim 1 wherein the layer of insulation material includes:
   a plurality of spaced-apart first strips of insulation material formed on the surface of the semiconductor material, the first strips of insulation material having first thicknesses; and
   a plurality of spaced-apart second strips of insulation material formed on the surface of the semiconductor material connected to the first strips of insulation material so that a second strip of insulation material is formed over each bit line, the second strips of insulation material having second thicknesses that are less than the first thicknesses.

3. The array of claim 2 wherein the plurality of bit lines are implanted into the surface of the semiconductor material.

4. The array of claim 3 wherein the contacts include doped polysilicon.

5. The array of claim 4 wherein the conductive word line includes doped polysilicon.

6. An antifuse array formed on a semiconductor material of a first conductivity type, the array having a plurality of sub-arrays, each sub-array comprising:
   a plurality of spaced-apart bit lines formed in the semiconductor material that extend across the array, the bit lines having a second conductivity type;
   a layer of insulation material formed on the semiconductor material over the bit lines, the layer of insulation material having a plurality of openings that expose a plurality of bit line regions on each bit line, the openings being arranged in rows and columns;
   a plurality of spaced-apart contacts formed on the bit line regions such that each contact is connected to an exposed bit line region;
   a layer of isolation material formed over the layer of insulation material and the contacts such that each contact has an exposed region;

a plurality of dielectric lines formed on the isolation material and the contacts so that a dielectric line is formed on the exposed region of each contact in a row of contacts, the dielectric lines extending across the array in a direction perpendicular to the bit lines;

a plurality of conductive word lines formed on the plurality of dielectric lines to contact the dielectric lines so that a word line is formed on each dielectric line;

a plurality of drain regions formed in the semiconductor material so that a drain region is formed at each end of each bit line;

a plurality of gate oxide regions formed on the semiconductor material so that a gate oxide region is connected to each drain region;

a plurality of source regions formed in the semiconductor material so that a source region is connected to each gate oxide region; and a pair of access lines formed on the gate oxide regions so that an access line is formed on each gate oxide region in a row of gate oxide regions.

7. The array of claim 6 wherein the layer of insulation material includes:

a plurality of spaced-apart first strips of insulation material formed on the surface of the semiconductor material; and a plurality of spaced-apart second strips of insulation material formed on the surface of the semiconductor material connected to the first strips of insulation material so that a second strip of insulation material is formed over each bit line.

8. The array of claim 7 wherein the plurality of bit lines are implanted into the surface of the semiconductor material.

9. The array of claim 8 wherein the contacts include doped polysilicon.

10. The array of claim 9 wherein the conductive material includes doped polysilicon.

11. A method for programming a row of antifuses in an antifuse array formed on a semiconductor material of a first conductivity type, the array comprising:

a plurality of spaced-apart bit lines formed in the semiconductor material that extend across the array, the bit lines having a second conductivity type;

a layer of insulation material formed on the semiconductor material over the bit lines, the layer of insulation material having a plurality of openings that expose a plurality of bit line regions on each bit line, the openings being arranged in rows and columns;

a plurality of spaced-apart contacts formed on the bit line regions such that each contact is connected to an exposed bit line region;

a layer of isolation material formed over the layer of insulation material and the contacts such that each contact has an exposed region;

a plurality of dielectric lines formed on the isolation material and the contacts so that a dielectric line is formed on the exposed region of each contact in a row of contacts, the dielectric lines extending across the array in a direction perpendicular to the bit lines; and a plurality of conductive word lines formed on the plurality of dielectric lines to contact the dielectric lines so that a word line is formed on each dielectric line;

the method comprising the steps of:

applying a first voltage to the word line connected to the row of antifuses to be programmed; and applying a second voltage to each bit line connected to each antifuse in the row of antifuses to be programmed.

12. The method of claim 11 wherein the first voltage is a programming voltage and the second voltage is ground.

13. The method of claim 11 wherein the first voltage is ground and the second voltage is a programming voltage.

14. The method of claim 11 wherein the first voltage is positive and the second voltage is negative.

15. The method of claim 11 wherein the first voltage is negative and the second voltage is positive.

* * * * *